United States Patent
Liu et al.

(10) Patent No.: US 10,803,222 B1
(45) Date of Patent: Oct. 13, 2020

(54) METHODS, SYSTEMS, AND COMPUTER PROGRAM PRODUCT FOR IMPLEMENTING AN ELECTRONIC DESIGN HAVING EMBEDDED CIRCUITS

(71) Applicant: Cadence Design Systems, Inc., San Jose, CA (US)

(72) Inventors: Jian Liu, Dublin, CA (US); Karthikeyan Mahadevan, Milpitas, CA (US); An-Yu Kuo, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 79 days.

(21) Appl. No.: 16/147,762

(22) Filed: Sep. 30, 2018

(51) Int. Cl.
  *G06F 30/00* (2020.01)
  *G06F 30/392* (2020.01)
  *G06F 30/394* (2020.01)

(52) U.S. Cl.
  CPC .......... *G06F 30/392* (2020.01); *G06F 30/394* (2020.01)

(58) Field of Classification Search
  CPC ............................ G06F 30/392; G06F 30/394
  See application file for complete search history.

(56) References Cited

U.S. PATENT DOCUMENTS

| | | | |
|---|---|---|---|
| 8,468,482 B1 | 6/2013 | Pack et al. | |
| 8,539,422 B2 * | 9/2013 | Dai | G06F 30/367 |
| | | | 716/133 |
| 8,631,381 B2 * | 1/2014 | Dai | G06F 30/367 |
| | | | 716/136 |
| 8,954,308 B2 * | 2/2015 | Choi | G06F 30/23 |
| | | | 703/14 |
| 9,672,308 B1 | 6/2017 | Majumder | |
| 9,672,319 B1 * | 6/2017 | Cao | G06F 30/394 |
| 9,715,570 B1 * | 7/2017 | Zhu | G06F 30/394 |
| 9,785,141 B2 | 10/2017 | Tripathi et al. | |
| 9,864,827 B1 | 1/2018 | Tan et al. | |
| 9,919,047 B2 | 3/2018 | Kim et al. | |
| 10,068,039 B1 * | 9/2018 | Vennam | H05K 3/0005 |
| 10,133,841 B1 | 11/2018 | Majumder et al. | |
| 10,192,020 B1 | 1/2019 | Ginetti | |
| 10,210,299 B1 | 2/2019 | Ginetti | |

(Continued)

OTHER PUBLICATIONS

U.S. Appl. No. 16/024,655, filed Jun. 29, 2018.

(Continued)

*Primary Examiner* — Naum Levin
(74) *Attorney, Agent, or Firm* — Vista IP Law Group, LLP

(57) ABSTRACT

Disclosed are methods, systems, and articles of manufacture for implementing an electronic design having embedded circuits. These techniques identify connectivity of an electronic design that includes an embedded circuit, and the embedded circuit is located between a first actual layer and a second actual layer of the electronic design. The electronic design is then transformed, but one or more embedded circuit modules, into a transformed electronic design at least by generating one or more artificial interconnects between the embedded circuit and a plurality of metal patches. The connectivity may be re-established based at least in part upon the plurality of metal patches. The electronic design may then be implemented based at least in part upon predicted behaviors of the transformed electronic design.

20 Claims, 19 Drawing Sheets

(56) References Cited

U.S. PATENT DOCUMENTS

| | | |
|---|---|---|
| 10,380,293 B1 | 8/2019 | Liu et al. |
| 2010/0171226 A1 | 7/2010 | West et al. |
| 2013/0298101 A1 | 11/2013 | Chandra |
| 2014/0282328 A1 | 9/2014 | Fried et al. |

OTHER PUBLICATIONS

Delakoura Angeliki, "3D Standard-Cell Placement Based on Circuit Partitioning", University of Thessaly, Jun. 2016.
Ahn, Byung-Gyu, et al. "Effective estimation method of routing congestion at floorplan stage for 3D ICs." JSTS: Journal of Semiconductor Technology and Science 11.4 (2011): 344-350.

* cited by examiner

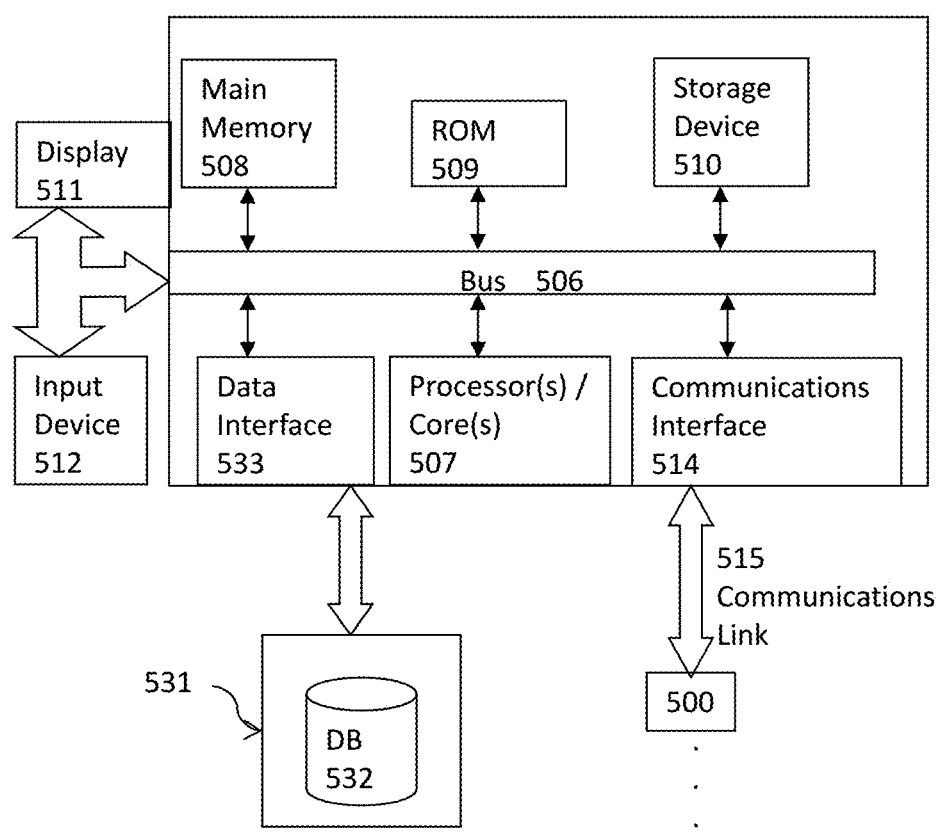

METHODS, SYSTEMS, AND COMPUTER PROGRAM PRODUCT FOR IMPLEMENTING AN ELECTRONIC DESIGN HAVING EMBEDDED CIRCUITS

BACKGROUND

Modern electronic design (e.g., IC package designs, printed circuit board or PCB designs, etc.) often include multi-layered structures to increase or maximize the available space. Accompanying the increasingly popular use of multi-layered structures is the analysis of the electromagnetic field for the electronic product. Three-dimensional (3D) solvers modeling the structures and analyzing the electromagnetic field in the three-dimensional space may be used to analyze the electrical characteristics and perform electromagnetic simulations yet require long and often prohibitively long runtime as well as large memory footprint to reach some reasonably accurate solutions. Pseudo-3D or two-and-a-half-dimensional (2.5D) solvers (collectively hybrid solvers or psuedo-3D solvers) have also been widely used due to their expediency and small memory footprint in reaching reasonably accurate solutions. These hybrid approaches pose a different set of problems with modern multi-layered electronic designs.

3D modeling tools and solvers model all structures of an electronic design (e.g., a printed circuit board or PCB design) in a 3D space and solve for the electrical characteristics and field domains in any direction. Because of the modeling and solving in the 3D space, the memory footprints as well as the computational costs associated with 3D solvers are often very expensive, if not prohibitively expensive. Hybrid modeling tools and solvers, on the other hand, are developed to solve for the electrical characteristics and parallel field domains (e.g., electromagnetic fields) between two parallel metal shapes.

Recent development in electronic designs often includes embedded circuits in IC (integrated circuit) package designs and PCB (printed circuit board) designs to minimize the parasitics (e.g., inductance) resulting from mounting ICs or IC packages. These embedded circuits are often embedded between two layers of an electronic design; and conventional electronic design automation tools have great difficulties in correctly characterizing or analyzing such an electronic design (e.g., correctly determining current return paths, etc.) prior to manufacturing, at least not in a computational cost effective way.

Conventional approaches tackle these challenges with at least a two-step approach that often needs to be performed iteratively. For example, in characterizing the behaviors of such an electronic design, conventional approaches characterize such an electronic design by solving the system of circuit equations (e.g., under the Kirchhoff circuit laws) to determine the electrical characteristics of the electronic design. These conventional approaches further perform a separate electromagnetic analysis that models the electronic design into a three-dimensional (3D) model solver and solves the Maxwell equation for the 3D model to determine the electric field around the 3D model. These conventional approaches may provide reasonably accurate characterization results yet consumes a huge amount of computational resources.

For example, these conventional approaches model every node of interest in the system of circuit equations under the Kirchhoff's circuit laws, save ports for these circuit nodes, perform electromagnetic extraction to determine the s-parameters, and further solve the electric field for the electronic circuit under the Maxwell equation. The challenge is that the size of s-parameters is of the order of magnitude of the square of the number of the circuit nodes. With the ever increasing complexity of modern electronic designs, these conventional approaches unnecessarily consume a huge amount of memory space to accommodate these models and s-parameters as well as a long processor runtime and a large number of processor cycles to determine the final characterization results. In addition, these conventional approaches often present a bottleneck in the design cycle and cause a significant delay in the implementation and manufacturing of the underlying electronic circuits.

Therefore, there exists a need for a method, system, and computer program product for implementing an electronic design having embedded circuits to address at least the aforementioned problems, shortcomings, and challenges. It shall be noted that some of the approaches described in this Background section constitute approaches that may be pursued, but not necessarily approaches that have been previously conceived or pursued. Therefore, unless otherwise explicitly stated, it shall not be assumed that any of such approaches described in this section quality as prior art merely by virtue of their inclusion in this section.

SUMMARY

Disclosed are method(s), system(s), and article(s) of manufacture for implementing an electronic design having embedded circuits in one or more embodiments. Some embodiments are directed at a method for implementing an electronic design having embedded circuits.

In some embodiments, the present invention identifies connectivity of an electronic design that includes an embedded circuit, and the embedded circuit is located between a first actual layer and a second actual layer of the electronic design. The electronic design is then transformed, but one or more embedded circuit modules, into a transformed electronic design at least by generating one or more artificial interconnects between the embedded circuit and a plurality of metal patches. The connectivity may be re-established based at least in part upon the plurality of metal patches. The electronic design may then be implemented based at least in part upon predicted behaviors of the transformed electronic design.

In some embodiments, a plurality of artificial layers may be added to the electronic design based at least in part upon the first actual layer and the second actual layer; and the plurality of metal patches may also be added to the plurality of artificial layers based at least in part upon the connectivity pertaining to at least the embedded circuit. In some of these embodiments that transform the electronic design into the transformed electronic design, a first circuit component may be identified from one or more circuit components in the electronic design based in part or in whole upon the connectivity of the electronic design; a first interconnect between the first circuit component and the electronic design may be removed; the first circuit component may be modified into a first modified circuit component based in part or in whole upon a first metal patch of the plurality of metal patches; and the first metal patch may also be modified into a first modified metal patch based at least in part upon the first modified circuit component.

In some embodiments, a second circuit component may be identified from the one or more circuit components in the electronic design based in part or in whole upon the connectivity of the electronic design; a second interconnect between the second circuit component and the electronic design may be removed; the second circuit component may be modified into a second modified circuit component based in part or in whole upon a second metal patch of the plurality of metal patches; and the second metal patch may also be modified into a second modified metal patch based at least in part upon the second modified circuit component.

In some of these embodiments, the embedded circuit may be identified in the electronic design; a node may be identified or created in the embedded circuit; a set of decoupling requirements may also be identified; and a position of a first artificial layer may be determined based at least in part upon the set of decoupling requirements. In addition or in the alternative, one or more electrical properties may be assigned to the first modified circuit component; an anti-pad may be determined for the first modified circuit component based at least in part upon the first artificial layer; and an objective for de-embedding may be determined based in part or in whole upon one or more characteristics of the electronic design.

In some embodiments, the position of the first artificial layer may be modified based in part or in whole upon the objective; one or more geometric characteristics may be determined for the first modified circuit component; and the first modified circuit component may be determined from the node to the first artificial layer with the anti-pad. To re-establish the connectivity, some embodiments connect the first modified circuit component to the transformed electronic design with a first modified artificial interconnect of the one or more artificial interconnects based at least in part upon the connectivity; the second modified circuit component may also be connected to the transformed electronic design with a second modified artificial interconnect of the one or more artificial interconnects based at least in part upon the connectivity; and a model may be generated for the transformed electronic design.

To generate the model, some embodiments determine one or more first modeling characteristics for the first modified circuit component; one or more second modeling characteristics may further be determined for a medium that is introduced by the first modified circuit component; and a model may be constructed for the transformed electronic design with at least one of the first modified circuit component, the first artificial layer, the one or more first modeling characteristics, or the one or more second modeling characteristics.

To implement the electronic design, some embodiments generate predicted electromagnetic wave responses at least by performing one or more analyses on a model that is built upon the transformed electronic design; one or more parameters may also be determined for the transformed electronic design with the predicted electromagnetic wave responses; and the electronic design may be implemented based at least in part upon the one or more parameters that are associated with one or more return paths.

Some embodiments are directed at a hardware system that may be invoked to perform any of the methods, processes, or sub-processes disclosed herein. The hardware system may include at least one processor or at least one processor core, which executes one or more threads of execution to perform any of the methods, processes, or sub-processes disclosed herein in some embodiments. The hardware system may further include one or more forms of non-transitory machine-readable storage media or devices to temporarily or persistently store various types of data or information. Some exemplary modules or components of the hardware system may be found in the System Architecture Overview section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some exemplary forms of the non-transitory machine-readable storage media may also be found in the System Architecture Overview section below.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIG. 5 illustrates a computerized system on which a method for implementing an electronic design having embedded circuits may be implemented.

DETAILED DESCRIPTION

Figure 1A:
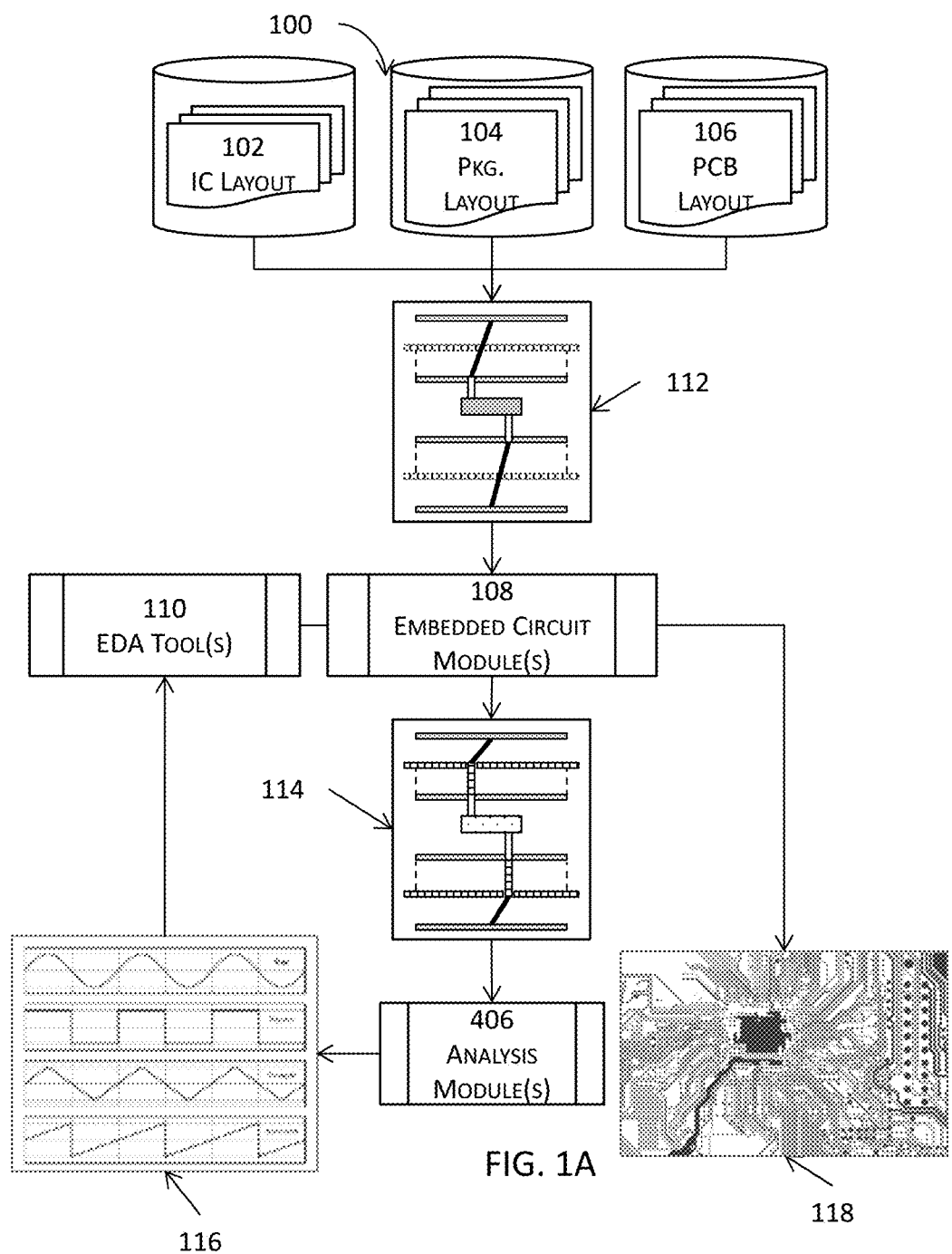
FIG. 1A illustrates a high level block diagram of a simplified system for implementing an electronic design having embedded circuits in one or more embodiments.

Various techniques are directed to implementing an electronic design having embedded circuits in various embodiments. In these embodiments, the present invention identifies an electronic design that includes embedded circuits between two layers (e.g., an actual upper layer and an actual lower layer) of the electronic design. An artificial upper layer is added atop the actual upper layer; and an artificial lower layer is added below the actual lower layer. An artificial upper metal patch and an artificial lower metal patch are then determined and respectively placed on the artificial upper layer and the artificial lower layer. These artificial metal patches are devised in such a way to cover the projected area of the embedded circuits when projected onto a plane (e.g., the artificial upper layer or the artificial lower layer).

One or more circuit components are modified with respect to the artificial upper metal patch or the artificial lower metal patch. For example, a first via connected to the actual upper layer may be extruded to the artificial upper layer placed atop the actual upper layer; and a second via connected to the actual lower layer may be extruded to the artificial lower layer placed below the actual lower layer. Respective antipads are created on the artificial upper and lower metal patches to prevent direct contact between these modified circuit components with the artificial metal patches. Connectivity is re-established for these modified circuit components in the transformed electronic design having the artificial layers, artificial metal patches, and modified circuit components. A model for the transformed electronic design may then be generated for analyses. The analysis results may then be used to guide the implementation (and hence the eventual fabrication and manufacturing) of the underlying electronic design.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention.

Further, various embodiments encompass present and future known equivalents to the components referred to herein by way of illustration. Moreover, it shall also be noted that the figures are intended only to facilitate the description of the disclosed embodiments and/or examples but are not representative of an exhaustive treatment of all possible embodiments and/or examples and are not intended to impute any limitations as to the scope of the claims, embodiments, and/or examples. In addition, any figures or their corresponding description need not necessarily portray all aspects or advantages in any particular environment. Any aspect or advantage described in conjunction with a particular embodiment and/or example is not necessarily limited to that embodiment and/or example and can be practiced in any other embodiments and/or examples even if not so illustrated. References throughout this specification to "some embodiments" or "other embodiments" refer to a particular feature, structure, material or characteristic described in connection with the embodiments as being included in at least one embodiment. Thus, the recitation of the phrases "in some embodiments" or "in other embodiments" in various places throughout this specification is not necessarily referring to the same embodiment or embodiments. The disclosed embodiments are not intended to be limiting of the claims.

In addition, unless otherwise explicitly stated, the recitation of the phrases "in some embodiments" or "in other embodiments" in this specification does not necessarily mean any of the features, advantages, aspects, etc. described "in some embodiments" do not or cannot be combined with any of the other features, advantages, aspects, etc. described "in other embodiments". Thus, any features, advantages, aspects, etc. described in this specification can be combined and can function in conjunction with each other, unless otherwise explicitly stated or recited.

FIG. 1 illustrates a high level block diagram of a simplified system for implementing an electronic design having embedded circuits in one or more embodiments. More specifically, an electronic design 112 may be identified from, for example, the memory or one or more storage devices 100. For example, a layout session of an EDA layout tool may open a first IC (integrated circuits) layout 102, a first IC package layout 104, or a first PCB (printed circuit board) layout 106 as the first layout 114.

One or more computing systems (not shown) may invoke and execute a plurality of modules, which are specifically programmed and stored at least partially in memory of and functions in conjunction with at least one microprocessor or processor core of the one or more computing systems, to perform various functions to implement electronic designs with embedded circuits. For example, the one or more computing systems may execute one or more embedded circuit modules (108) to identify connectivity (e.g., schematic connectivity, layout connectivity, etc.) for the electronic design 112. The one or more embedded circuit modules (108) may further add a plurality of artificial layers or planes to the electronic design 112 and add a plurality of metal patches onto these artificial layers or planes. The one or more embedded circuit modules further modify certain circuit components into modified circuit components based at least in part upon the plurality of metal patches, re-establish connectivity between these one or more modified circuit components and the remainder of the electronic design 112 based at least in part upon the original connectivity and the modifications made, and generate a transformed electronic design 114.

In some embodiments, the one or more embedded circuit modules 108 may further build 3D or pseudo-3D (e.g., 2.5D) model(s) for the transformed electronic design 114 and forward this model to one or more analysis modules 406. These one or more analysis modules 406 combine the Maxwell equation for the model with the Kirchhoff's circuit equations into a single matrix formulation and solve this single matrix formulation to determine predicted electrical behaviors 116 (e.g., waveforms, nodal values, electric field distribution, etc.) of the transformed electronic design 114. For example, some embodiments may model an embedded multi-node electronic design to accurately handle equipotential port grouping with the following matrix formulation:

$$\begin{bmatrix} Y_{FEM} & 0 & C \\ 0 & Y_{circuit} & I \\ C^T & I & 0 \end{bmatrix} \times \begin{bmatrix} E \\ V_{circuit} \\ I_{circuit} \end{bmatrix} = [I_{source}],$$

In the coefficient matrix of the above matrix formulation, $Y_{FEM}$ denotes admittance matrix of finite element equations; $Y_{circuit}$ denotes admittance matrix of circuit equations; C denotes coupling terms between finite element unknowns and circuit unknowns; I denotes identity matrix; and CT denotes transpose of C. In the variables, E denotes finite element unknowns (electric field); $V_{circuit}$ denotes voltage; and $I_{circuit}$ denotes current. $I_{source}$ on the right-hand side denotes the current source vector. With this matrix formulation, a solver such as an electromagnetic solver can solve for the electromagnetic field together with embedded multi-node circuits, without setting up ports as circuit nodes then combine s-parameter and multi-node circuits in a simulator as conventional approaches do.

These predicted electrical behaviors may further be provided to one or more EDA (electronic design automation) tools 110 to implement, modify, optimize, perform sign-off and design closure. The present invention may provide a version of the electronic design (e.g., the signed-off version) as an input to the manufacturing or fabrication equipment so as to cause the manufacturing of the underlying electronic circuits 118 to occur.

The present invention provides a more efficient and more accurate solution to address at least the shortcomings and problems with conventional approaches. Actual benchmarks on real-world electronic designs have shown that the present invention reduces the processor runtime by nearly ten times (10×) for the same electronic design. The present invention also reduces the memory usage by at least 15% uses much fewer initial and final elements (e.g., for finite element approaches) while predicting the electrical behaviors with identical or nearly identical accuracy as the current state-of-the-art physics-based analysis tools. The present invention thus provides much better efficiencies in turns of processor runtime and memory footprint than conventional approaches.

Figure 1B:
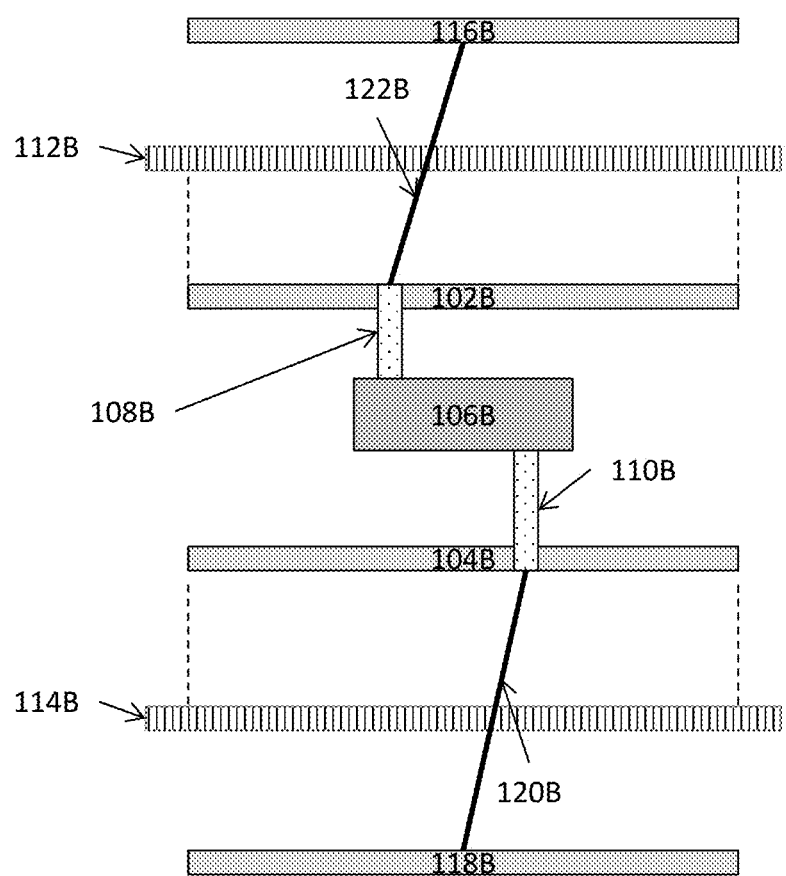
FIGS. 1B-1C illustrate a portion of a simplified electronic design having embedded circuits to which some or all techniques described herein apply in one or more embodiments.
Figure 1C:
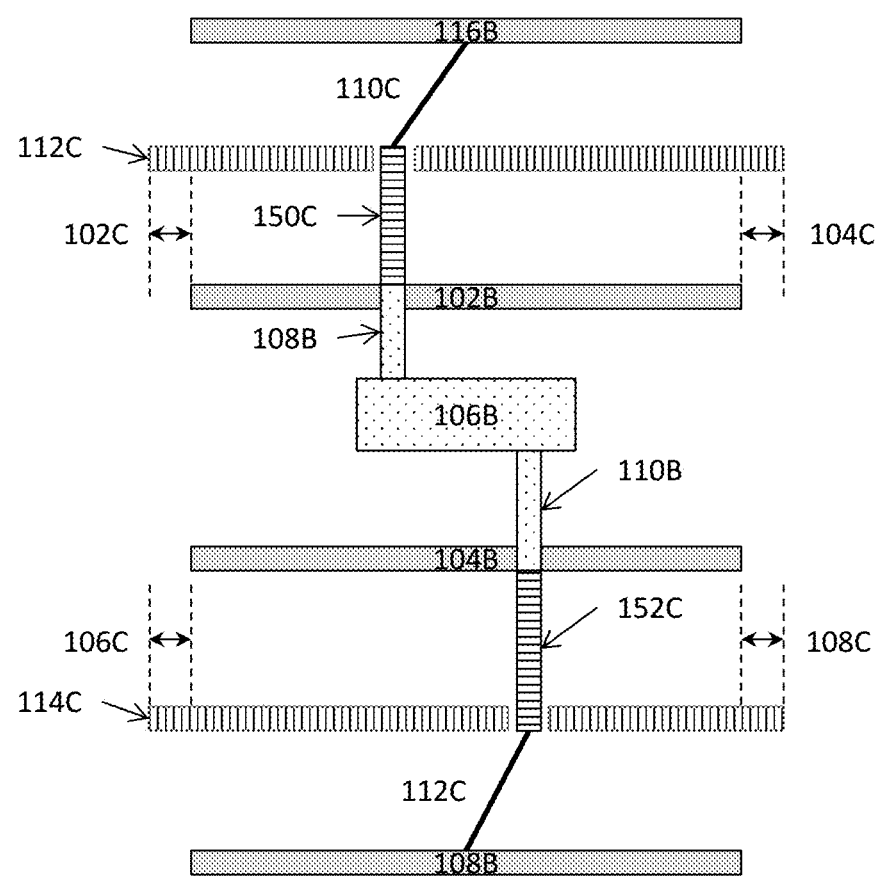

FIGS. 1B-1C illustrate a portion of a simplified electronic design having embedded circuits to which some or all techniques described herein apply in one or more embodiments. More specifically, FIG. 1B illustrates a portion of a simplified electronic design that includes embedded circuits 106B. The embedded circuits 106B are located between two actual layers—102B and 104B—of the electronic design. In some embodiments, neither actual layer is the topmost or bottom-most layer of an electronic design (e.g., an IC package design or a PCB design). For example, the electronic design illustrated in FIG. 1B may include layer 116B atop layer 102B as well as layer 118B below layer 104B.

The embedded circuits 106B are connected to layer 102B by interconnect 108B (e.g., a via) which is further connected to, for example, a node on layer 116B by interconnect 122*b*. The embedded circuits 106B are further connected to layer 104B by interconnect 110B which is further connected to, for example, another node on layer 118B by interconnect 120B. Further, FIG. 1B shows that the present invention starts modifying the electronic design by adding two artificial layers or planes upon which metal patches 112B and 114B are created and added to the electronic design.

Each metal patch is devised to cover at least the projected area of the embedded circuits (e.g., protecting the areas occupied by the embedded circuits onto an added artificial layer) plus some additional margin (e.g., 102C, 104C, 106C, and 108C in FIG. 1C). This margin may be uniform or non-uniform on the sides of the embedded circuits. The additional margin may be used for connecting existing ground vias to the metal patches so that the metal patches are grounded. The additional margin may also be used for inserting additional, fictitious ground vias (that do not exist in the original electronic design) so that the two metal patches are not only properly grounded but also provide sufficient ground vias for other purposes (e.g. for routing, etc.) These additional margins are also added to produce a more uniform electric field in the region of interest (e.g., the region containing the embedded circuits 106B) for better-behaved electromagnetic analyses. Studies have shown that a margin about 10% provides good predicted results.

The size of an artificial ground via may not be so big to cause undesirable electromagnetic interferences that skew the electrical behaviors of the original circuit. The size of an artificial ground via may not be too small to cause numerical instability. For example, if a great disparity exists between the size of an artificial ground via and other circuit components, the resulting model either has to be discretized with an unnecessarily large number of meshes that cripple even the most powerful computing systems or with ill-formed mesh shapes (e.g., meshes with very large internal angles or very small internal angles) that are known to cause numerical instability. In some embodiments, the present invention determines the size or a range of sizes for artificial ground vias based at least in part upon the numerical stability criterion and the circuit components in the electronic design (or a portion thereof) to provide expedient yet stable solutions.

FIG. 1C illustrates additional details of transforming the original electronic circuit into a transformed electronic design. In addition to adding two metal patches as shown in FIG. 1B, the present invention further removes some connectivity (e.g., 120B and 122B) and modify certain circuit components. For example, once interconnects 120B and 122B are removed, via 108B may be extruded to the upper metal patch 112C to form the extruded via (150C). Similarly, via 110B may be extruded to the lower metal patch 114C to form the extruded via (152C).

These two extruded vias cannot contact the respective metal patches that are already grounded by existing ground vias. As a result, a clearance needs to be created on both the metal patch 112C and the metal patch 114C. This clearance is illustrated as the openings on 112C and 114C (as compared to the originally added metal patches 112B and 114B in FIG. 1B). Once the circuit components are modified, connectivity is re-established.

In this example illustrated in FIGS. 1B-1C, via 108 was originally connected to 116B by interconnect 122B; and via 110B was originally connected to 118B by interconnect 120B. These two interconnects 120B and 122B are first removed for circuit component modification (e.g., via extrusion). Once the circuit component modifications are completed, the present invention may reconnect the first extruded via (108B and 150C) to layer 116B by interconnect 110C and reconnect the second extruded via (110B and 152C) to layer 118B by interconnect 112C. It shall be noted that although the embedded circuits are shown to be embedded between two immediately neighboring layers in FIGS. 1B-1C, various techniques described herein apply with full and equal effects for embedded circuits that are located between two layers that are not necessarily immediately neighboring either other in other embodiments.

Figure 1D:
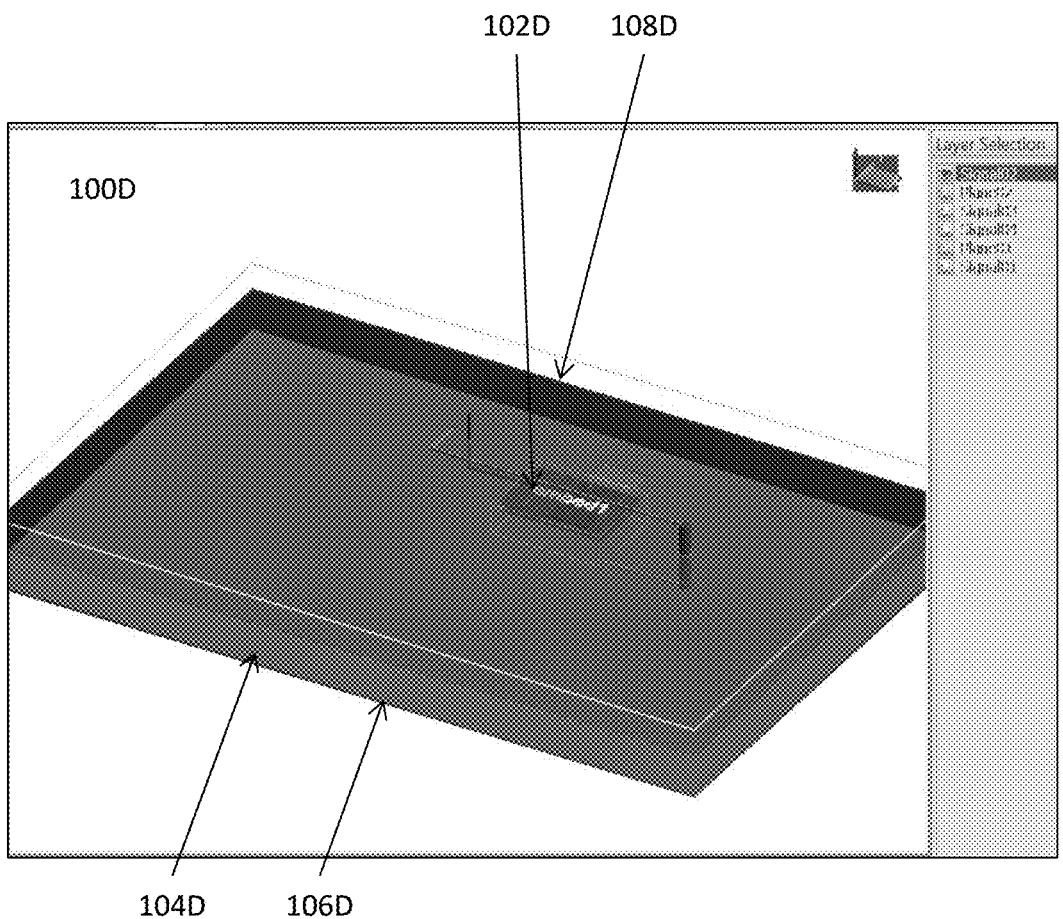
FIGS. 1D-1I illustrates some examples of a portion of a simplified electronic design having embedded circuits to which some or all techniques described herein apply in one or more embodiments.
Figure 1E:
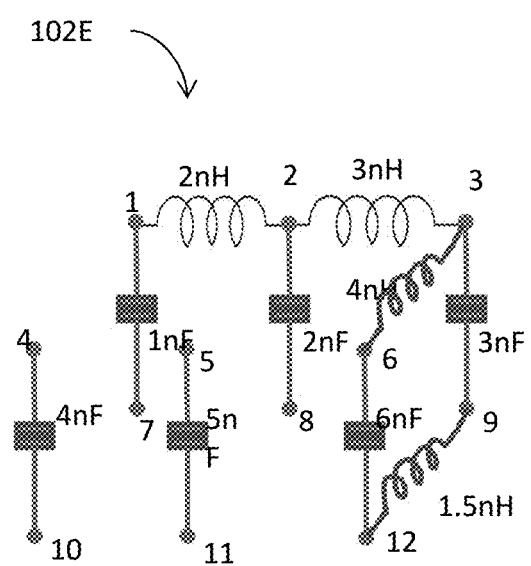

FIGS. 1D-1I illustrates some examples of a portion of a simplified electronic design having embedded circuits to which some or all techniques described herein apply in one or more embodiments. More specifically, FIG. 1D illustrates a three-dimensional (3D) model 100D of a portion of a simplified example electronic design. This 3D model 100D includes the embedded circuits 102D that are embedded between the first actual layer 104D and the second actual layer 106D. This 3D model 100D further includes an artificially inserted metal patch 108D that covers the embedded circuits 102D with some margins all around. FIG. 1E illustrates a simplified example 102E of embedded circuits illustrated in FIG. 1D.

Figure 1F:
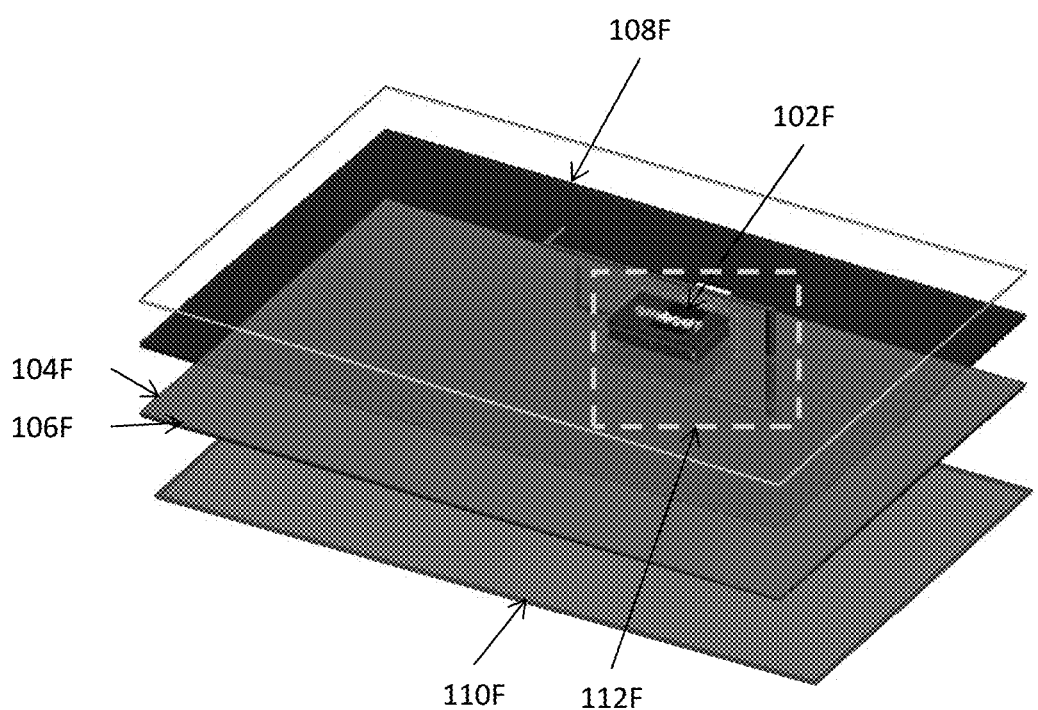

FIG. 1F illustrates an example of an example electronic design having embedded circuits 102F that are located between the first actual layer 104F and the second actual layer 106F. FIG. 1F further includes the additional metal patch 108F that is inserted above the first actual layer 104F as well as another additional metal patch 110F that is inserted below the second actual layer 106F.

The spacing between the upper metal patch 108F and the upper layer 104F is not arbitrarily determined. Neither is the spacing between the lower metal patch 110F and the upper layer 106F. In some embodiments where the upper layer 104F is not the uppermost layer in the electronic design, and the lower layer 106F is not the bottom-most layer, the upper metal patch 108F is to be positioned above upper layer 104F yet below the next higher layer. Similarly, the lower metal patch 110F is to be positioned below the lower layer 106F yet above the next lower layer.

Figure 1G:
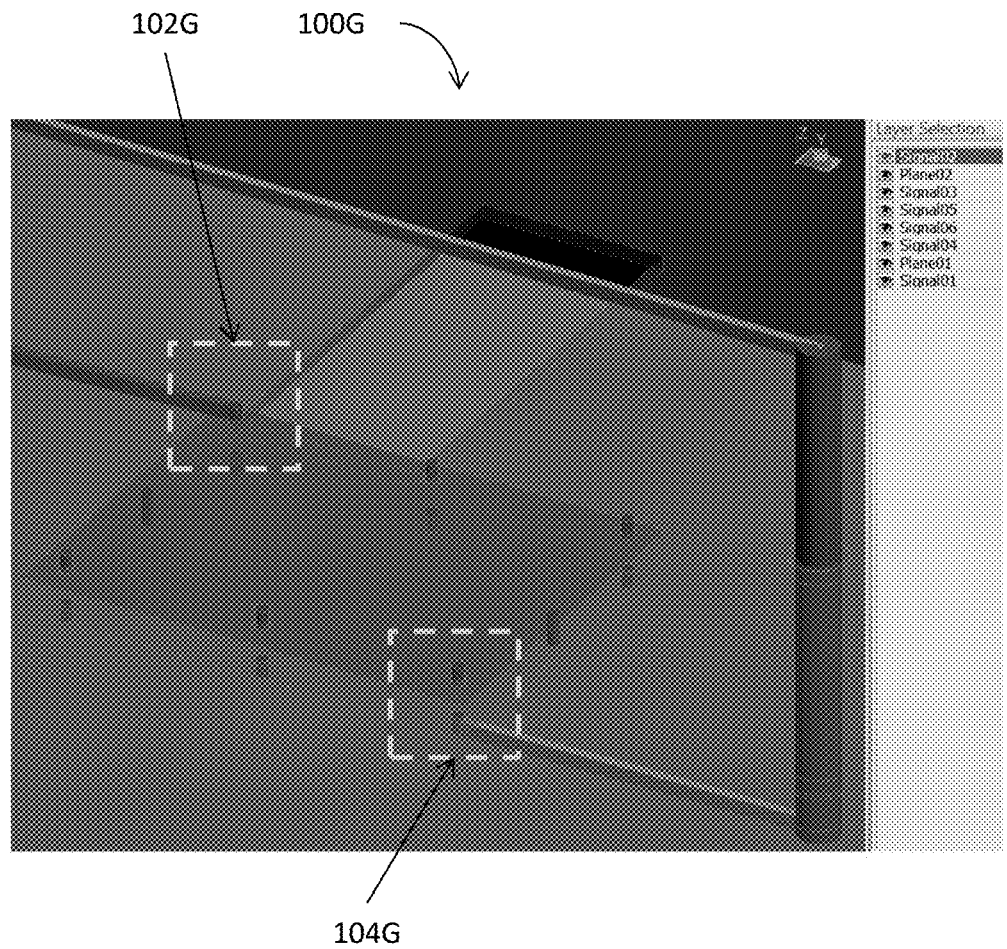
Figure 1H:
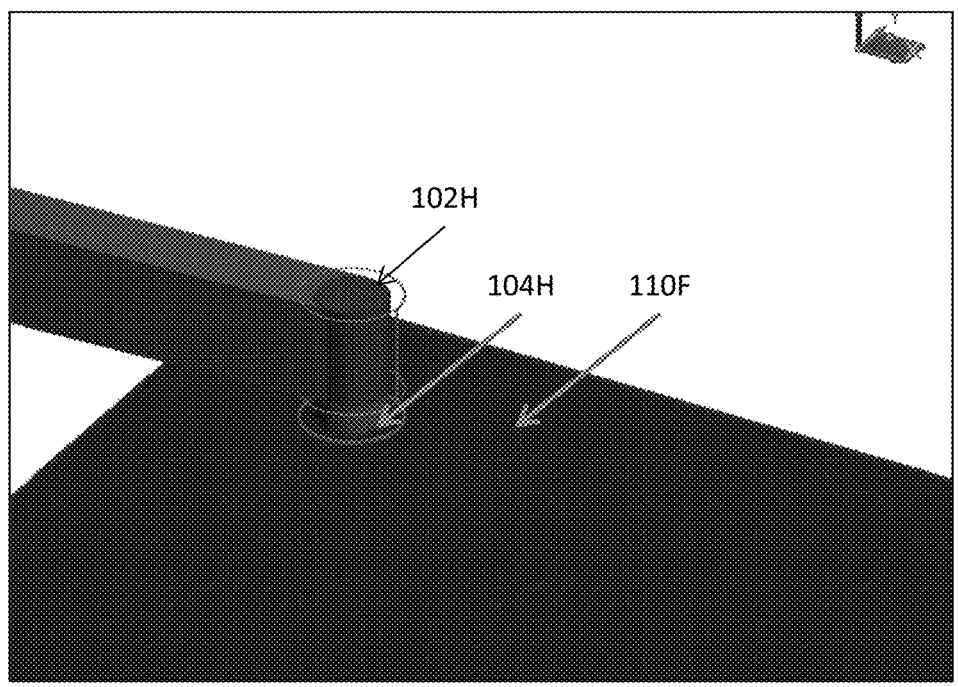
Figure 1I:
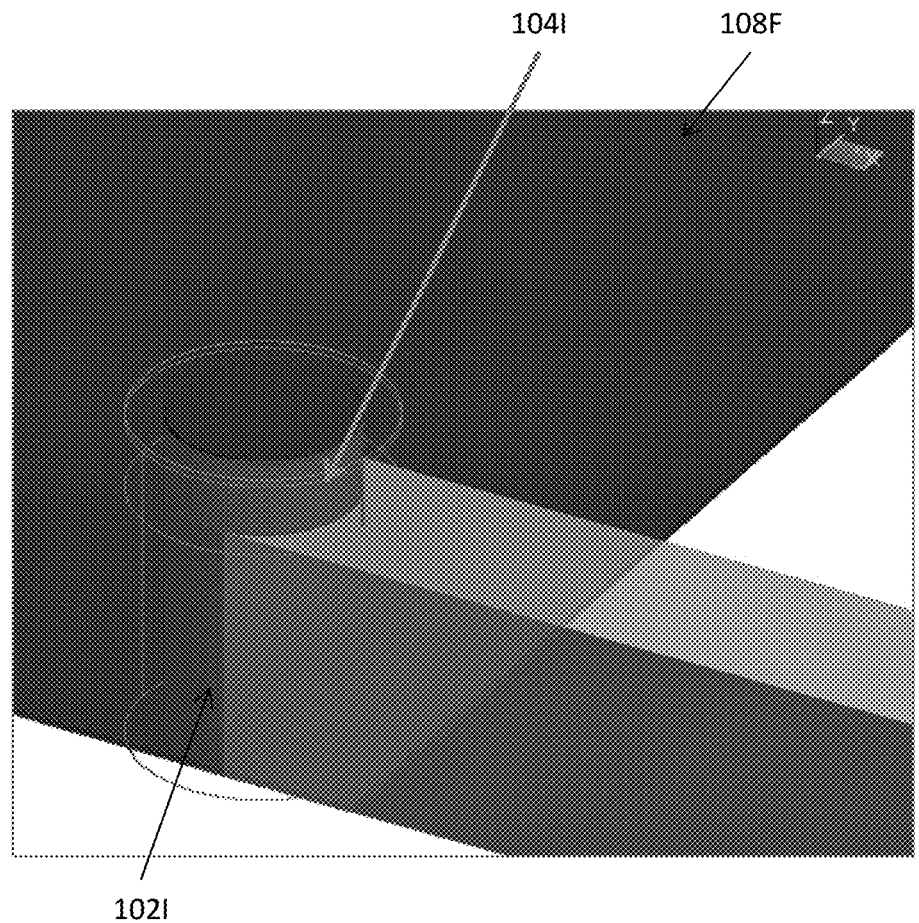

FIG. 1G illustrates a zoomed-in view 100G of a smaller portion (112F in FIG. 1F) of the electronic design illustrated in FIG. 1F. FIG. 1H illustrates a zoomed-in view of a smaller portion (102G in FIG. 1G) of the electronic design illustrated in FIG. 1G. FIG. 1H further illustrates an extruded terminal 102H that is extruded to the metal patch 110F with the clearance 104H so that the extruded terminal 102H does not contact the metal patch 106H. FIG. 1I illustrates another zoomed-in view of a smaller portion (104G in FIG. 1G) of the electronic design illustrated in FIG. 1G. FIG. 1I further illustrates an extruded terminal 102I that is extruded to the metal patch 108F with the clearance 104I so that the extruded terminal 102I does not contact the metal patch 108F.

Figure 1J:
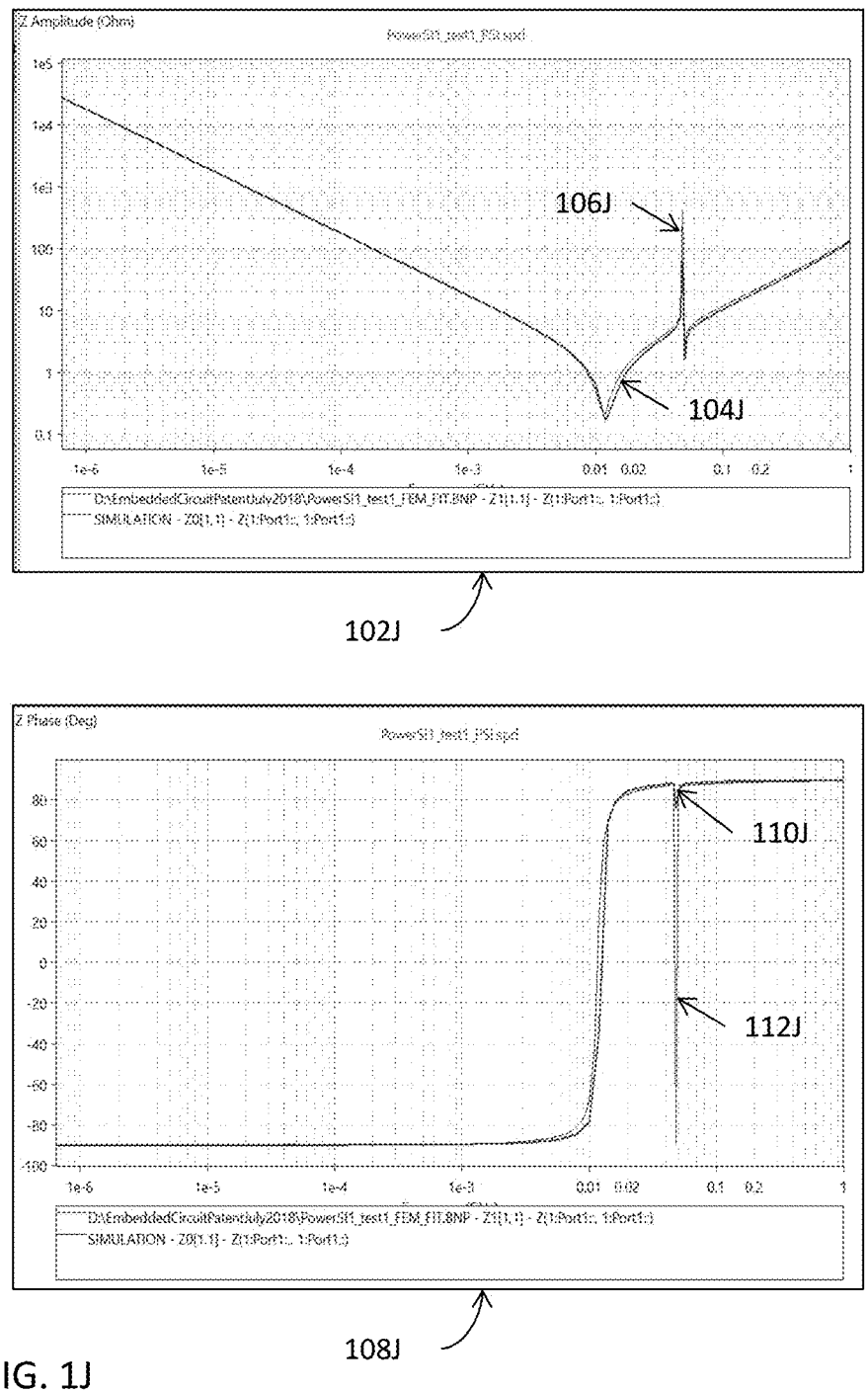
FIG. 1J illustrates some example outputs of predicted circuit behaviors generated by the claimed invention in comparison with conventional 3D techniques in one or more embodiments.

FIG. 1J illustrates some example outputs of predicted circuit behaviors generated by the claimed invention in comparison with conventional 3D techniques in one or more embodiments. More specifically, FIG. 1J includes the first plot 102J showing the Z-amplitude plot in Ohms generated by the state-of-the-art physics-based approaches (106J) and the Z-amplitude plot in Ohms generated by the present invention (104J). As the plot 102J shows, the results (104J) generated by the present invention are identical to or at least substantially identical to the results (106J) generated by the state-of-the-art physics-based approaches.

FIG. 1J further includes the second plot 108J showing the Z-phase plot in degrees generated by the state-of-the-art physics-based approaches (112J) and the Z-phase plot in degrees generated by the present invention (110J). As the plot 104J shows, the results (110J) generated by the present invention are identical to or at least substantially identical to the results (112J) generated by the state-of-the-art physics-based approaches.

Figure 2:
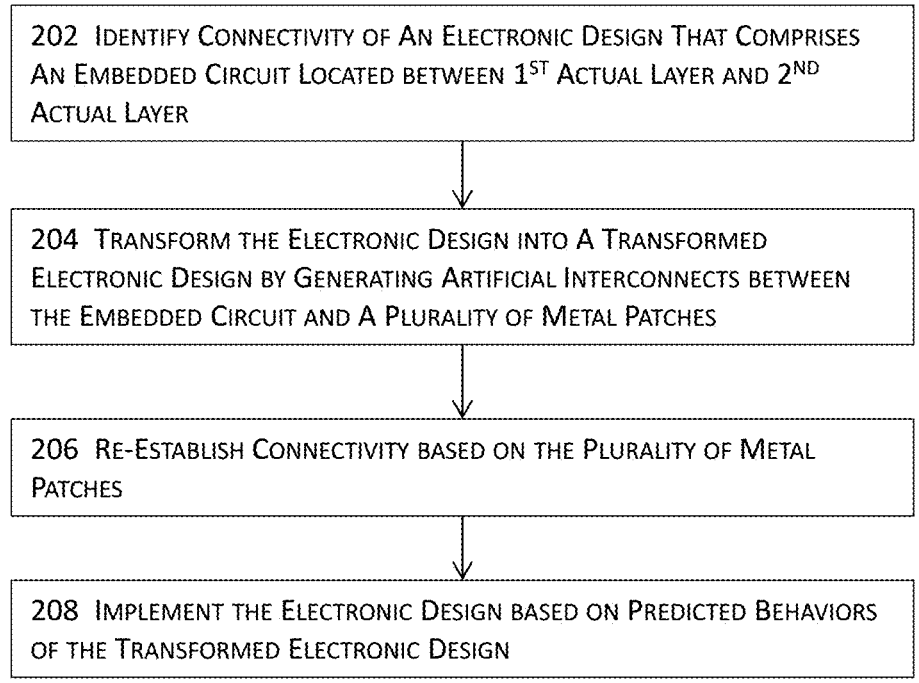
FIG. 2 illustrates a high level block diagram for implementing an electronic design having embedded circuits in one or more embodiments.

FIG. 2 illustrates a high level block diagram for implementing an electronic design having embedded circuits in one or more embodiments. In these embodiments, the connectivity of an electronic design that includes embedded circuits may be identified at 202. These embedded circuits are located between two actual layers that may or may not necessarily be immediately neighboring each other in the electronic design. Such embedded circuits may be added to, for example, reduce or minimize inductances due to mounting of certain electronic components in the electronic design.

The electronic design may be transformed into a transformed electronic design at 204 at least by generating a plurality of artificial interconnects between the embedded circuits and a plurality of metal patches. A metal patch is also artificially inserted into the electronic design by first creating an artificial layer and then creating the metal patch on the artificial layer. Therefore, both the artificial layer and the metal patch are artificially created and are not part of the original electronic design.

Furthermore, a metal patch is specifically devised to cover the projected area of the embedded circuits with some margins remaining around the projected area when the embedded circuits are projected onto a plane (e.g., projected onto the corresponding artificial layer). That is, a metal patch is particularly devised to be larger than the area spanned by the embedded circuits by some margins that are included for the various purposes such as providing more uniform electric field in the region of interest in the electronic design (e.g., the volume containing the embedded circuits), for inserting artificial ground nodes or vias, etc. Actual implementations and benchmarks of electronic designs have shown that a margin of about 10% provides reasonably good results in the implementation and analyses of electronic designs.

Studies have demonstrated that the size of the opening is akin to the anti-pad concept based at least in part upon the size of the circuit component (e.g., via, port, terminal, etc.) for which the opening is provided. In some embodiments, the size of the anti-pad for a circuit component may be determined as larger than the size of circuit component and smaller than 200% of the size of circuit component. For example, the diameter of the anti-pad for a via may be determined to be 140% of the diameter of the via in some of these embodiments. In some embodiments, the size of an artificial layer may also be determined based at least in part upon the size of a circuit component that is modified with respect to the artificial layer. In some embodiments, the distance from the center of a circuit component to one edge of an artificial layer with respect to which the circuit component is modified may be determined as 100%-500% of the size of the circuit component that is modified with respect to the artificial layer. For example, the distance from the center of a via to an edge of an artificial layer to which the via is extruded to may be 240% of the diameter of the via that is modified by extrusion to the artificial layer in some embodiments.

The spacing between a metal patch and the corresponding actual layer is not arbitrarily determined. For example, the spacing may be determined to be limited by a maximum spacing value between two immediately adjacent layers although a metal patch may be placed sufficiently close to the corresponding actual layer so long as such placement does not adversely impact numerical stability of subsequent modeling and analyses. Transforming an electronic design into a transformed electronic design may include removing some existing connectivity in the electronic design, modifying certain circuit components based on the metal patches, re-establishing the connectivity with the modified circuit components, etc. More details about transforming an electronic design into a transformed electronic design are described below with reference to FIGS. 3A-3B and 3D.

The connectivity in the original electronic design may be removed during the process 204 of transforming the electronic design into a transformed electronic design. Connectivity may thus be re-established at 206 based on the plurality of metal patches and one or more modified circuit components in the transformed electronic design. For example, an interconnect between a circuit component and a linkage element may be removed prior to modifying the circuit component into a modified circuit component. Once the circuit component is modified into a modified circuit component, connectivity may be re-established by inserting a different interconnect (although artificial due to the artificial nature of the metal patch and the modified circuit component) between the modified circuit component and the original linkage element in the electronic design. More details about re-establishing the connectivity in a transformed electronic design are described below with reference to FIGS. 3C and 3E.

With the transformed electronic design and the re-established connectivity, the electronic design may be implemented at 208 based at least in part upon predicted behaviors of the transformed electronic design. The predicted behaviors may be obtained by performing one or more analyses (e.g., electromagnetic analyses). Moreover, the implementation of an electronic design at 208 may include, for example, implementing, modifying, optimizing, and/or performing sign-off and design closure on the electronic design, as well as eventually providing the signed off version of the electronic design as an input to the manufacturing equipment so as to cause the manufacturing of the underlying electronic circuit to occur. More details about some aspects of implementing the electronic design at 208 are described below with reference to FIG. 3F.

Figure 3A:
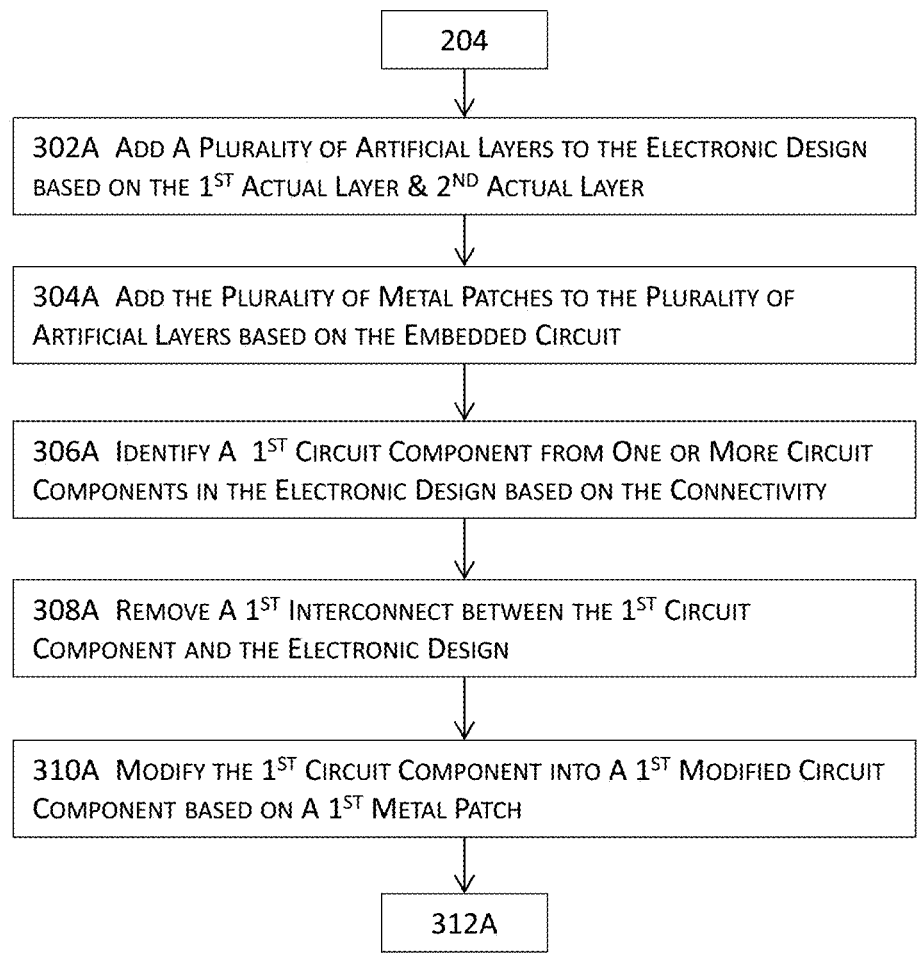
FIGS. 3A-3F illustrate more details about a portion of the high level block diagram illustrated in FIG. 2 in one or more embodiments.
Figure 3B:
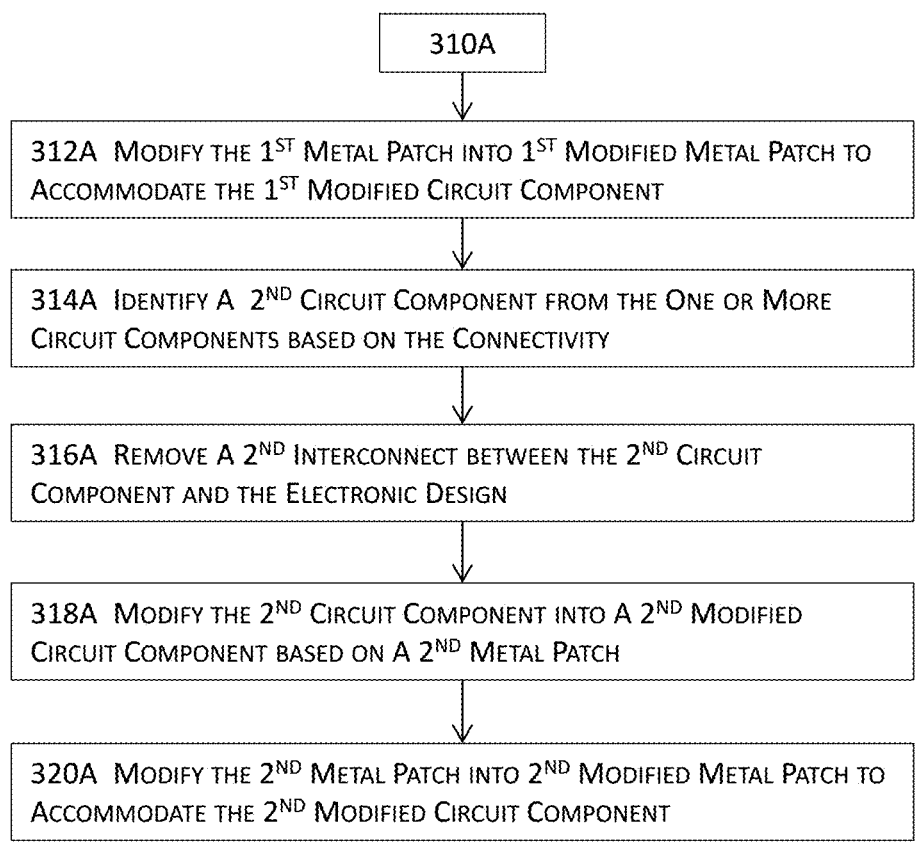

FIGS. 3A-3F illustrate more details about a portion of the high level block diagram illustrated in FIG. 2 in one or more embodiments. FIGS. 3A-3B illustrate more details about transforming an electronic design into a transformed electronic design (204) illustrated in FIG. 2 and described above. More specifically, a plurality of artificial layers may be added at 302A to the electronic design. The plurality of artificial layers may be added based in whole or in part upon the plurality of actual layers corresponding to the embedded circuits in the electronic design. One of the objectives of inserting the plurality of artificial layers is to create metal patches on these artificial layers so as to for at least one pair of parallel metal shapes that encloses the embedded circuits in the electronic design.

With the objective in mind, some embodiments places a first artificial layer above the upper actual layer and a second artificial layer below the lower actual layer so that the embedded circuits in the electronic design are sandwiched between the first and second artificial layers. An artificial layer may be a reference plane as long as a computer tool can create and place a metal patch thereon. With the plurality of artificial layers, a plurality of metal patches may be added at 304A to the plurality of artificial layers. In the aforementioned example having a first and second artificial layers, an upper metal patch may be created on the first artificial layer, and a lower metal patch may be created on the second artificial layer so that these two metal patches form a pair of parallel metal shapes enclosing the embedded circuits. In some embodiments, these two metal patches have identical external boundaries (although each may have different openings to clear respective modified circuit components as described below) to make subsequent modeling and analyses more efficient.

A metal patch, as described above, is particular devised to cover the projected area of the embedded circuits with some margin (e.g., 10% on one side or both sides along an axis) beyond the projected area when the embedded circuits are projected onto a plane (e.g., onto an artificial layer). In some embodiments, these metal patches have identical external boundaries (although each may have different openings to clear respective modified circuit components as described below) to make subsequent modeling and analyses more efficient. In addition, various embodiments and figures describe these metal patches as having some rectangular form although it shall be noted that other shapes and forms are also contemplated and may be determined based in part or in whole upon, for example, requirements of subsequent modeling and/or analyses.

A first circuit component may be identified at 306A from one or more circuit components in the electronic design. In some embodiments, the first circuit component may be identified based at least in part upon the connectivity of the electronic design. For example, the circuit components that connect the embedded circuits to the actual layers that enclose the embedded circuits may be identified at 306A. These circuit components may include, for example, ports, vias, terminals, interconnects, etc. Unlike conventional approaches that need to process every node of interest (e.g., every pin, port, terminal, etc. so long as an electrical characteristic such as voltage or current is desired at the node) and reserve a port for every such node in the electronic design, the present invention only identifies the circuit components that are connected to the actual layers. As a result, the number of nodes for the electromagnetic analysis modeling (and hence the memory footprint and processor runtime) is greatly reduced than conventional approaches.

The first interconnect between the first circuit component identified at 306A and the electronic circuit (e.g., a link element such as a node on an actual layer of the electronic design) may be removed at 308A. The removal of the first interconnect is to accommodate subsequent modifications to the first circuit component. It shall be noted that the removal of the first interconnect invariably alters the connectivity of the electronic design so the connectivity needs to be re-established afterwards to ensure proper functionality of the electronic design. Therefore, the link element to which the first interconnect is connected as well as the first circuit component may be flagged (e.g., in a design database) for subsequent processing to re-establish connectivity.

The first circuit component may be modified into a first modified circuit component at 310A. This modification may be based in whole or in part on the first artificial layer or the first metal patch that corresponds to the first circuit component. In the aforementioned example having the upper metal patch on the upper artificial layer and the lower metal patch on the lower artificial layer, a circuit component may be modified with respect to the metal patch that corresponds to the actual layer to which the circuit component is connected. For example, if a circuit component is connected to the upper actual layer, this circuit component may be modified with respect to the upper metal patch. On the other hand, if another circuit component is connected to the lower actual layer, this circuit component may be modified with respect to the lower metal patch.

Modifying the first circuit component may include, for example, extruding the circuit component to the first metal patch to form an extruded circuit component (e.g., extruded via, extruded terminal, etc.) Nonetheless, any contact between the extruded circuit component and the metal patch will change the behavior of the electronic design. As a result, a clearance opening may be required on the first metal patch to accommodate the extruded circuit component. At 312A, the first metal patch may be modified into a first modified metal patch to accommodate the first modified circuit component. This modification to the first metal patch may include, for example, creating an opening on the first metal patch to clear the modified circuit component. Moreover, the size of the opening may be determined in such a way that, for example, the voltage drop caused by the electric field between the modified circuit component and the metal patch represents the desired voltage at the modified circuit component (e.g., the first metal patch is grounded by the ground nodes in the transformed electronic design).

A second circuit component may be identified at 314A from one or more circuit components in the electronic design. Like the first circuit component, the second circuit component may be identified based at least in part upon the connectivity of the electronic design. For example, the circuit components that connect the embedded circuits to the actual layers that enclose the embedded circuits may be identified at 306A.

A second interconnect between the second circuit component identified at 314A and the electronic circuit may be removed at 316A. Like that for the first interconnect, the removal of the second interconnect is also to accommodate subsequent modifications to the second circuit component. It shall also be noted that the removal of the second interconnect invariably alters the connectivity of the electronic design so the connectivity needs to be re-established afterwards to ensure proper functionality of the electronic design. Therefore, the link element to which the second interconnect is connected as well as the second circuit component may be flagged (e.g., in a design database) for subsequent processing to re-establish connectivity.

The second circuit component may be modified into a first modified circuit component at 318A. To distinguish from the first circuit component identified at 306A, the first and second circuit components are connected to different metal patches. This modification to the second circuit component may thus be based in whole or in part on the second artificial layer or the second metal patch that corresponds to the second circuit component.

Modifying the second circuit component may include, for example, extruding the second circuit component to the second metal patch to form an extruded circuit component. Like that between the first circuit component and the first metal patch, a clearance opening may be required on the second metal patch to accommodate the modified second circuit component so that the modified second circuit component are not in contact with the second metal patch. At 320A, the second metal patch may be modified into a second modified metal patch to accommodate the second modified circuit component. This modification to the second metal patch may include, for example, creating an opening on the second metal patch to clear the modified second circuit component.

Figure 3C:
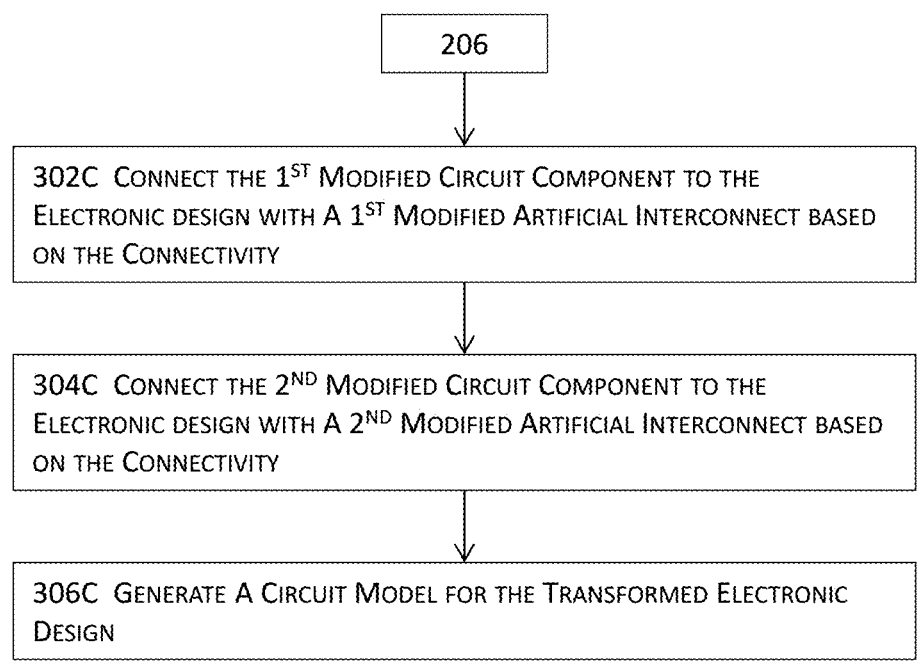

FIG. 3C illustrates more details about re-establishing connectivity (206) illustrated in FIG. 2 and described above after the removal of some connectivity and the modifications to the first and second circuit components. In some embodiments, the first modified circuit component may be connected to the electronic design with a first modified interconnect at 302C. In the aforementioned example where the first circuit component connects to a first linkage element on the first metal patch by a first interconnect, the first interconnect is removed to accommodate the subsequent modification to the first circuit component. The first linkage element and the first circuit component are flagged for subsequent connectivity re-establishment. The present invention may thus connect the first modified circuit component to the first link element by using a first modified interconnect.

In the examples illustrated in FIGS. 1B-1C and described above, the first interconnect (122B) is originally connected to a node on layer 116B and is later removed to accommodate the subsequent extrusion of the first circuit component (108B) to form the first modified circuit component (108B plus 150C in FIG. 1C). Connectivity may then be re-established between this first modified circuit component (108B plus 150C) and the original node on layer 116B with the first modified interconnect (110C).

Similarly, the second modified circuit component may be connected to the electronic design with a second modified interconnect at 304C. In the examples illustrated in FIGS. 1B-1C and described above, the second interconnect (110B) is originally connected to another node on layer 108B and is later removed to accommodate the subsequent extrusion of the second circuit component (110B) to form the second modified circuit component (110B plus 152C in FIG. 1C). Connectivity may also be re-established between this second modified circuit component (110B plus 152C) and the original node on layer 108B with the second modified interconnect (112C). A circuit model may then be generated at 306C for the transformed electronic design having the re-established connectivity.

Figure 3D:
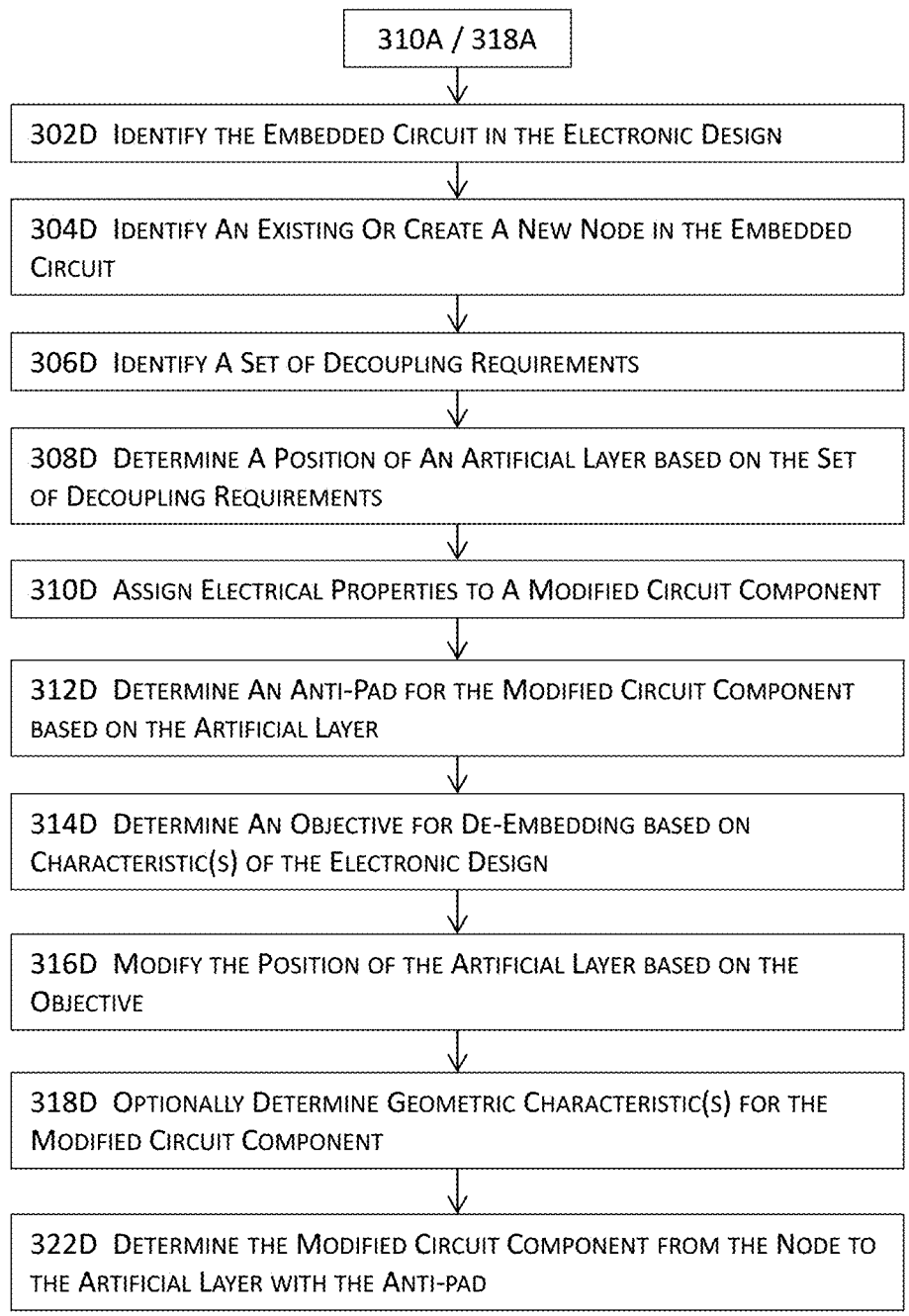

FIG. 3D illustrates more details about modifying a circuit component (310A and 318A) described above. In some embodiments, the embedded circuits may be identified at 302D; and a node or a connectivity node may be identified (if pre-existing) or generated (if non-existent) at 304D in the embedded circuit. In these embodiments, a node or a connectivity node includes a point or circuit component at which the portion of the electronic circuit design is connected to a linkage circuit element.

A node may be identified by referencing the connectivity information which includes the identifications (e.g., names) of the connections (e.g., pins, pads, ports, vias, etc.) in the embedded circuits and the identifications of the corresponding connections in one or more linkage circuit elements (e.g., external circuitry or ports) beyond the embedded circuits. In addition or in the alternative, the connectivity information may include the nets, net segments, or traces interconnecting the portion of the electronic circuit design and the one or more linkage circuit elements, and these nets, net segments, or traces may be annotated or associated with the connection identifications to indicate which circuit components these nets, net segments, or traces are interconnecting.

A set of decoupling requirements may be identified at 306D. The set of decoupling requirements may include, for example, reducing or minimizing capacitance, reducing or minimizing inductance, or a combination thereof. For example, for an RF design, an audio processing design, an amplifier design, a high frequency design, or a signal processing design, higher capacitance is known to cause undesirable parasitic oscillations. In this example, the set of decoupling requirements may include a requirement to reduce or minimize coupling capacitance. This set of decoupling requirements may be configured with or without accommodating the inductance effects. As another example, for an electronic design with an emphasis on power requirements, thermal behavior, or reliability, the set of decoupling requirements may include a requirement to reduce or minimize inductance values to reduce or minimize the effective resistance of conductors.

To reduce or eliminate the number of conductors outside any parallel field domains, a position of an artificial layer may be determined at 308D. The position of an artificial layer may be determined to reduce or eliminate conductors outside any parallel field domains. For an in-plane model of an electronic circuit design to be analyzed, solved, or simulated with a hybrid or 2.5D solver, it may be first determined which side an artificial layer may be added to accomplish the objective of reducing or eliminating conductors outside parallel field domains. Once the side is determined, the actual position of an artificial layer may be determined while accommodating subsequent creation of a metal patch and modification of circuit components as described herein.

The position of an artificial layer may be determined based in part or in whole upon the set of decoupling requirements in some embodiments. For example, an artificial layer may be placed closer to the metal shape from which one or more circuit components are modified (e.g., extruded) to reduce the overall lengths of these one or more modified circuit components (e.g., extruded vias) in order to reduce inductance in some embodiments. As another example, an artificial layer may be placed as far away from the metal shape from which one or more circuit components are modified (e.g., from which one or more vias are extruded) to reduce or minimize coupling capacitance. As another example, an artificial layer may be placed to account for both the coupling capacitance concerns and the inductance concerns.

On the other hand, placing an artificial layer closer to the metal layer underneath may cause larger eddy currents and hence greater reduction of the self-inductance for the signal path introduced by the addition of the reference plane. Another effect of placing an artificial layer closer to the metal layer from which circuit components are modified is the higher coupling capacitance between the artificial layer and the metal layer. Higher capacitance may cause undesirable parasitic oscillation, especially in radio frequency designs, audio processing designs, electronic amplifier designs, digital signal processing designs, etc. For example, parasitic capacitances between the output and the input of an amplifier circuit may act as a feedback path causing the amplifier circuit to oscillate at a high frequency. In some higher frequency designs, parasitic capacitances may also combine with stray inductance to form resonant circuits that lead to resonant circuits (e.g., self-resonant circuits).

This larger coupling capacitance may be managed by a de-embedding flow that will be described in greater details below. On the other hand, an artificial layer may also be placed relatively far away from the metal shape from which one or more circuit components are modified. Placing an artificial layer far away from the metal shape results in a lower coupling capacitance between the reference plane and the metal shape. Nonetheless, the modified circuit components (e.g., extruded vias) will have longer lengths and hence exhibit higher inductances that may be undesirable for high frequency alternating current (AC) signals. High inductance also imposes stronger opposition to the change in the electric current from the Lenz's Law and is thus undesirable for power designs or other aspects such as thermal, reliability, etc. of electronic designs.

This higher inductance may also be managed by a de-embedding flow that will be described in greater details below. In some embodiments, an artificial layer may be determined at a location that exhibits a relatively low coupling capacitance while using a de-embedding flow to manage the inductance to reduce, minimize, or eliminate disturbances to the original behavior of the electronic design. In other embodiments, an artificial layer may be determined at a location that exhibits a relatively low inductance while using the de-embedding flow to manage the coupling capacitance to reduce, minimize, or eliminate disturbances to the original behavior of the electronic design. In yet some other embodiments, an artificial layer may be determined at a location while using a de-embedding flow to manage both the inductance and the coupling capacitance to reduce, minimize, or eliminate disturbances to the original behavior of the electronic design.

At 310D, one or more electrical properties may be assigned to modified circuit components. For example, an extruded via may inherit one or more actual electrical properties (e.g., capacitance, resistance, and/or inductance) of a metal shape (e.g., the metal shape from which the extruded via is extruded) or an existing via that is to be further extruded to an artificial layer. As another example, an extruded via may be modeled to include one or more artificial values including zero capacitance, zero resistance, and/or low inductance. It shall be noted that a model constructed pursuant to the techniques described herein may or may not necessarily have the same electrical properties.

Via clearances or anti-pads on the artificial layer may be determined at 312D so that the electronic design may be re-connected to the one or more linkage elements after introducing the artificial layer and one or more modified circuit components (e.g., extruded terminals) into the model. A via clearance may be determined in an identical or substantially similar manner as that for an anti-pad, which represents spacing between an extruded via and the boundary of the corresponding aperture in the reference plane in some embodiments.

An objective for de-embedding may be optionally identified or determined at 314D based in part or in whole upon one or more characteristics of the underlying electronic design. In some embodiments, an objective may include removing or reducing the additional capacitance caused by the introduction of an artificial layer, removing or reducing the inductances caused by the introduction of a modified circuit component, or removing both the additional capacitance caused by the introduction of an artificial layer and removing or reducing the inductances caused by the introduction of a modified circuit component.

A de-embedding process may be used to reduce, minimize, or eliminate the effects (e.g., resistance inductance, and/or capacitance) caused by the introduction of the artificial layer and/or the modified circuit components on the electrical behavior of the electronic circuit in some embodiments. An objective may include, for example, a first objective to reduce, minimize, or completely eliminate coupling capacitances introduced by the addition of a reference or one or more extruded vias, a second objective to reduce, minimize, or eliminate inductance introduced by the addition of an artificial layer or one or more modified circuit components, or any combinations thereof, etc. The one or more characteristics may include the application, function, intended purpose, type, etc. of the electronic circuit design.

For example, the objective listed above may be identified for an electronic circuit design with an emphasis on power, reliability, or thermal stability, etc. As another example, the first objective listed above may be identified at 314D for an electronic circuit design (e.g., radio frequency designs, audio processing designs, electronic amplifier designs, digital signal processing designs, etc.) that is more susceptible to parasitic oscillations and thus has embedded circuits.

At 316D, the position of the artificial layer may be optionally modified at 316D based in part or in whole upon the objective identified or determined at 314D. At 318D, the geometric characteristics of a modified circuit component may be optionally determined. The geometric characteristics may include the diameter, the cross-section shape or size, and/or the length of a via. For example, the diameter or cross-section profile may or may not be the same as that of the existing via in some embodiments where the extruded via is extruded from an existing via although modeling the extruded portion with the same diameter or cross-section profile may be easier for modeling and/or analyses of the electronic circuit design. In some embodiments, the diameter or cross-section profile of an extruded via may include a default or predetermined or a randomly selected value or profile. In these embodiments, the side effects introduced by the extruded portion of a via may be reduced, minimized, or eliminated by the de-embedding process and/or by the selection of appropriate electrical properties of various circuit components (e.g., the reference plane, the via, etc.)

A modified circuit component may thus be determined at 322D with respect to or based at least in part upon the node identified at 304D, the artificial layer, and the anti-pad determined at 312D. For example, a via may be extruded to the bottom surface, the top surface, or any surface in between the top surface and the bottom surface of the artificial layer. In some embodiments, the extruded portion of a via may be extruded so that the extruded via does not protrude beyond the top surface (or bottom surface, depending on the positioning of the reference plane) of the artificial layer to avoid creating another portion of the via outside parallel field domains. A model may be constructed at 324D for the transformed electronic design with at least the modified circuit component(s), the artificial layers, and one or more modeling characteristics.

The transformed electronic design having the modified circuit components and re-established connectivity may be analyzed or simulated at 326D by an electromagnetic analysis module and the model constructed at 324D to generate, for example, electromagnetic wave responses for the electrical behavior of the electronic circuit design. The electromagnetic analysis module may solve the electromagnetic behaviors (e.g., electromagnetic wave responses) under the Maxwell equation and the electronic circuit (e.g., nodal voltage values, electric currents, etc.) under Kirchhoff's circuit laws together. One or more circuit behavior characteristics such as a current return path for a modified circuit component (e.g., an extruded via) may be determined with the analysis or simulation results.

A modeling characteristic may be a characteristic of a modified circuit component (e.g., an extruded via) in the model constructed at 324E. Modeling characteristics may include, for example, one or more electrical and/or physical properties or characteristics a modified circuit component represented in the model. It shall be noted that the extruded portion of a via constitutes a factitious via portion in the electronic design because the actual electronic design does not include such an extruded portion. As a result, the one or more modeling characteristics (e.g., capacitance, resistivity, inductance, one or more other physical properties, etc.) may be determined to minimize the artificial effects introduced by the addition of an extruded via into an electronic circuit design.

In some of these embodiments, an extruded portion of a via may be modeled with zero capacitance, zero resistivity, and low inductance. These one or more modeling characteristics may also include the characteristics of one or more other components that may interact with or may be influenced by a modified circuit component. For example, the electrical and/or physical properties of the reference plane to which an extruded via is extruded, the electrical and/or physical properties of the medium of the artificial region encompassing the extruded via, etc. may also be determined as a part of the one or more modeling characteristics.

In some embodiments, the modified portion of a circuit component (e.g., the extruded portion of a via) may be modified so that the modified circuit component does not protrude beyond the top surface (or bottom surface, depending on the positioning of the reference plane) of the reference plane to avoid creating another portion of the via outside parallel field domains. Moreover, these one or more modeling characteristics pertaining to the artificial medium of the artificial region may include the capacitance, the resistivity, and/or the inductance of the medium in some embodiments. In some of these embodiments, the artificial medium may be modeled with low capacitance and/or low inductance to reduce the artificial effects caused by the reference plane and/or extruded vias while maintaining numerical stability.

Figure 3E:
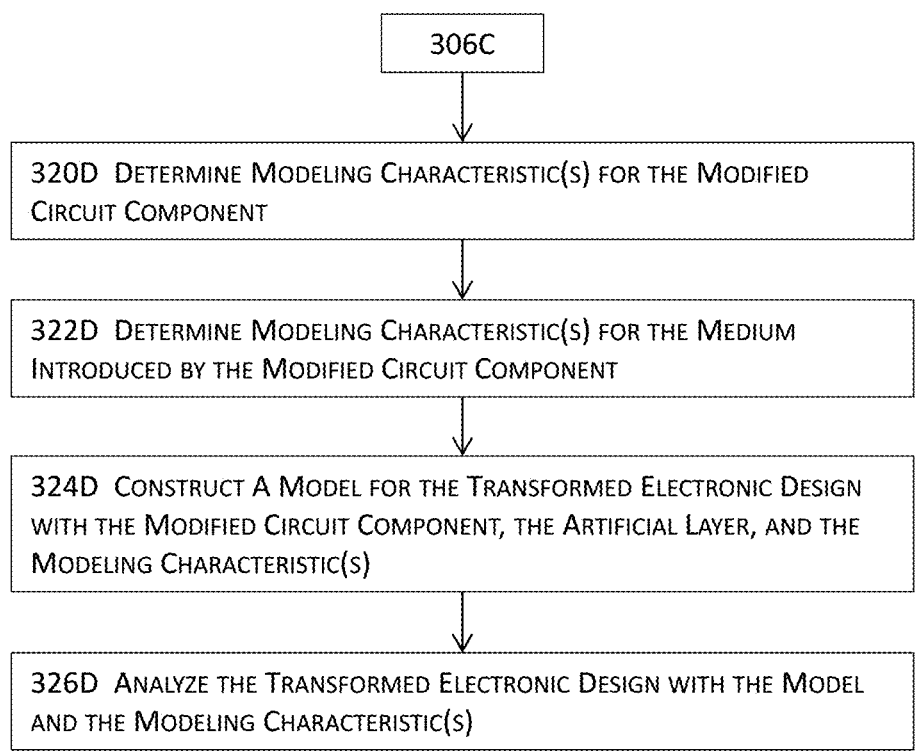

FIG. 3E illustrates more details about creating a circuit model for the transformed electronic design (306C). In these embodiments, one or more modeling characteristics may be determined at 320D. For example, one or more electrical and/or physical properties or characteristics may be identified. It shall be noted that the extruded portion of a via constitutes a factitious via portion in the electronic design because the actual electronic design does not include such an extruded portion. As a results, the one or more modeling characteristics (e.g., capacitance, resistivity, inductance, one or more other physical properties, etc.) may be determined to minimize the artificial effects introduced by the addition of an extruded via into an electronic circuit design.

In some of these embodiments where the modified circuit component includes an extruded via, an extruded portion of a via may be modeled with zero capacitance, zero resistivity, and low inductance. These one or more modeling characteristics may also include the characteristics of one or more other components that may interact with an extruded via. For example, the electrical and/or physical properties of the artificial layer to which an extruded via is extruded, the electrical and/or physical properties of the medium of the artificial region encompassing the extruded via, etc. may also be determined.

In addition to the one or more modeling characteristics for the modified circuit components determined at 320D, one or more modeling characteristics for the medium introduced by the modification to the circuit components (e.g., extrusion of a terminal) may also be determined at 322D. These one or more first modeling characteristics may include the capacitance, the resistivity, and/or the inductance of the medium in some embodiments. In some of these embodiments, the medium may be modeled with low capacitance and/or low inductance to reduce the artificial effects caused by the reference plane and/or extruded vias while maintaining numerical stability. A model may then be constructed at 324 including the electronic circuit design, the artificial layers, one or more modified circuit components, the re-established interconnects, and the medium.

Figure 3F:
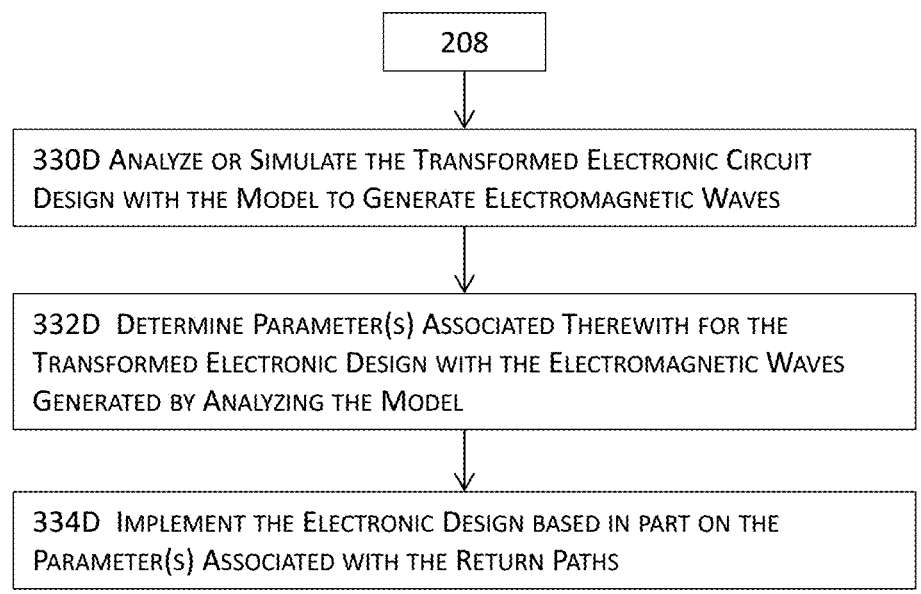

FIG. 3F illustrates more details about implementing the electronic design based on predicted behaviors the transformed electronic design (208) illustrated in FIG. 2 and described above. The electronic design may be first analyzed or simulated at 330D with the model representing and built upon the transformed electronic design. In some embodiments, the present invention may use a hybrid solver or a pseudo-3D (e.g., 2.5D) solver to perform the analyses or simulations performed with respect to the model at 330D to generate, for example, electromagnetic wave responses for the electrical behavior of the transformed electronic design.

In some of these embodiments, one or more parameters associated therewith may be determined at 332D with the analysis or simulation results obtained from 330D. In some embodiments, a return path for an extruded via is automatically determined with the added reference plane. In some embodiments, the one or more parameters may include, for example, EMI current (electromagnetic interference current), RFI current (radio frequency interference current), transfer voltage, shielding requirement parameters, transfer parameters (e.g., transfer impedance, etc.), scattering parameters (s-parameters), Z-parameters, H-parameters, ABCD-parameters, s-parameter models, push/pull currents from return paths, or any combinations thereof, etc. In addition, the electronic design may be implemented, created, or modified 334D based in part or in whole upon the one or more parameters and/or the one or more return paths in some embodiments.

Figure 4:
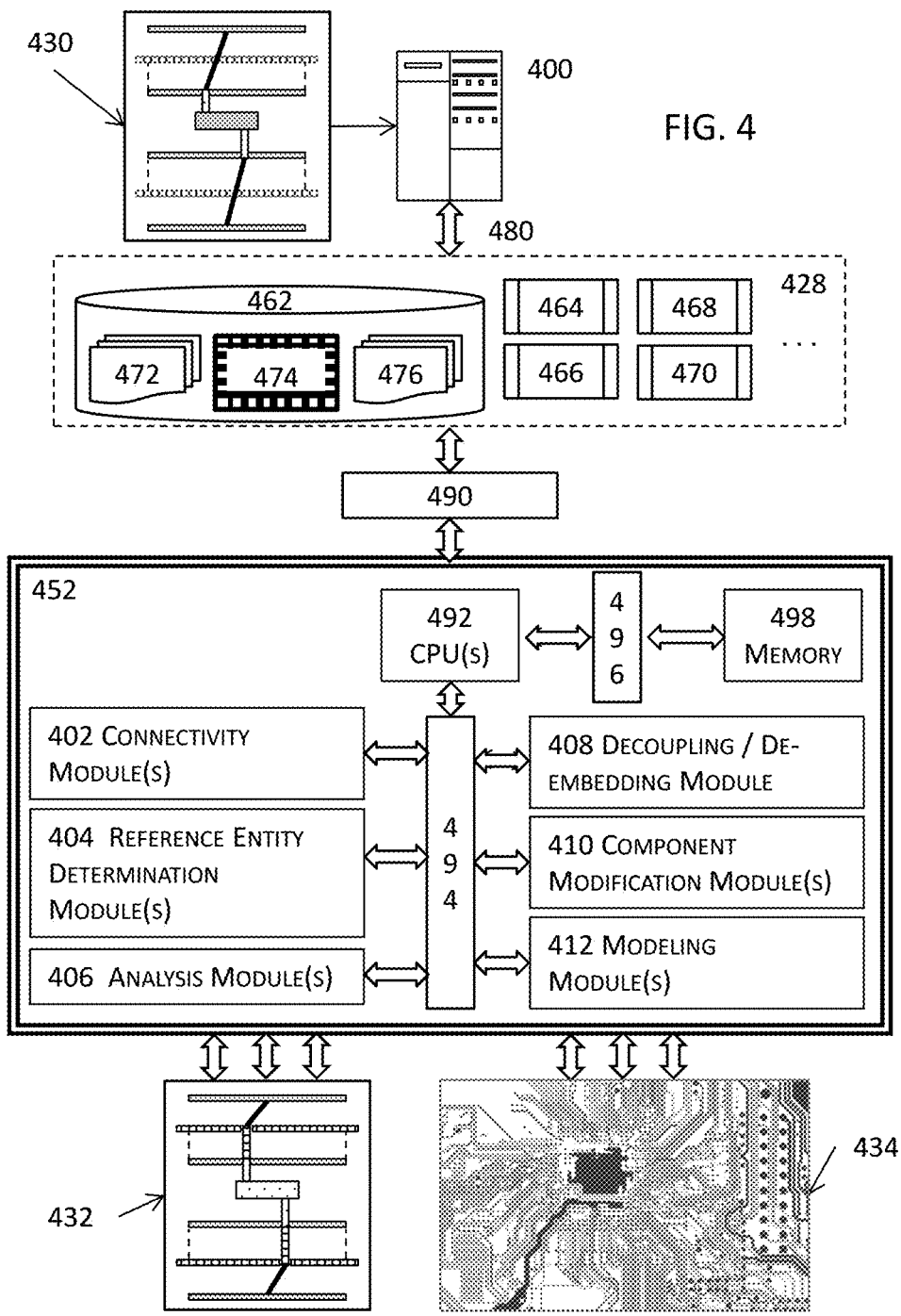
FIG. 4 illustrates an example computing system for implementing an electronic design having embedded circuits in one or more embodiments.

FIG. 4 illustrates an example computing system that performs various implementing an electronic design having embedded circuits in one or more embodiments. More specifically, the computing system 400 in FIG. 4 may comprise one or more computing systems 400, such as a general purpose computer described in the System Architecture Overview section to implement one or more special proposes. The illustrative system in FIG. 4 may include an Internet-based computing platform providing a shared pool of configurable computer processing resources (e.g., computer networks, servers, storage, applications, services, etc.) and data to other computers and devices in an ubiquitous, on-demand basis via the Internet. For example, one or more computing resources and/or modules illustrated in FIG. 4 may be located in a cloud computing platform in some embodiments.

In this illustrated system in FIG. 4, one or more computing systems 400 may invoke and execute various modules to identify an electronic design 430 (e.g., a PCB layout, etc.) or a portion thereof. These one or more computing systems 400 may identify the embedded circuits and the connectivity for the electronic design 430. The one or more computing systems 400 then perform various processes to transform the electronic design 430 into a transformed electronic design 432.

For example, these one or more computing systems 400 may then add two artificial layers or planes to the electronic design 430 and create a metal patch on each of the two artificial layers to cover the projected area of the embedded circuits. These two metal patches are then connected to the respective ground nodes in the electronic design 430. These one or more computing systems 400 may then modify certain circuit components (e.g., vias connecting the embedded circuits to other linkage elements such as nodes in the electronic design 430) into modified circuit components (e.g., extruded vias) with respect to the two added artificial layers.

The interconnects between the non-modified circuit components and one or more linkage elements may be removed or ignored before the modifications to these circuit components. Certain clearance (e.g., anti-pads) between these modified circuit components and the two patches are created so the electric potential difference between a modified circuit component and its corresponding clearance with a metal patch indicates the voltage of the modified circuit component. New artificial interconnects are re-established between these modified circuit components and the original linkage elements in the electronic design 430 to complete the transformed electronic design 432. The present invention may then cause the occurrence of manufacturing or fabrication of the electronic circuits 434 at least by forwarding a final version (e.g., a signed-off version) of the electronic design to fabrication equipment.

The one or more computing systems 400 may thus determine or generate a model for this transformed electronic design 432 with the artificial layers, metal patches, modified circuit components, and modified connectivity. The one or more computing systems 400 may then combine the Maxwell equation (for determining the electric field around the model) and Kirchhoff's system of circuit equations into a single matrix formulation and solve the single matrix formulation together to characterize the electrical behaviors of the transformed electronic design 432. These characterized electrical behaviors may then be provided to EDA (electronic design automation) tools to implement, modify, optimize, perform sign-off and design closure, and eventually to provide the signed off version of the electronic design as an input to the manufacturing equipment so as to cause the manufacturing of the underlying electronic circuit to occur.

The one or more computing systems 400 may invoke and execute a plurality of modules, which are specifically programmed and stored at least partially in memory of and functions in conjunction with at least one microprocessor (e.g., 492) or processor core of the one or more computing system s 400, to perform various functions described herein to transform the electronic design 430 into the transformed electronic design 432. For example, the one or more computing systems 400 may execute one or more connectivity modules (402) that identify the connectivity of the electronic design 430. These one or more computing systems 400 may optionally execute one or more reference entity determination modules (404) to generate, for example, the aforementioned artificial layers in the electronic design 430. One or more decoupling and de-embedding modules (408) may also be executed to decouple and/or de-embed side effects introduced by the application of some of the techniques described herein.

One or more component modification modules 410 may function in conjunction with a reference entity determination module 404 to modify one or more circuit components (e.g., vias, ports, etc.) in the electronic design 430 into one or more modified circuit components (e.g., extruded vias, etc.) in the transformed electronic design 432 based in part or in whole upon, for example, the aforementioned artificial layers. One or more modeling modules 412 may construct a 3D or a pseudo-3D (e.g., 2.5D) model for the transformed electronic design 432 by, for example, combining the Maxwell equation (for determining the electric field around the model) and Kirchhoff's system of circuit equations into a single matrix formulation. This 3D or pseudo-3D model may then be forwarded to one or more analysis modules 406 that solve the single matrix formulation together to characterize the electrical behaviors of the transformed electronic design 432.

In some embodiments, the one or more computing systems 400 may invoke various system resources such as the processor(s) or processor core(s), memory, disks, etc. The one or more computing systems 400 may also initiate or interact with other computing systems to access, via a computer bus architecture (e.g., a system bus, a control bus, a data bus, or any combinations thereof), various resources 428 that may comprise a floorplanner, a global routing engine, and/or a detail routing engine 464, a layout editor 466, a design rule checker 468, a verification engine 470, etc. In some embodiments, each design fabric may have its own dedicated, native engines, editors, checkers, etc. mentioned above. In some other embodiments, multiple design fabrics (e.g., an IC package design fabric and an IC design fabric) may use a single unified tool (e.g., a single, unified layout editor) that performs its functions to fulfill the respective needs in these multiple design fabrics.

These various resources 428 may further include, for example, one or more other EDA (electronic design automation) modules such as a schematic tool, a placement tool, a routing tool, verification tools, post-route or post-layout optimization tools, various photolithography tools (e.g., optical proximity correction or OPC tools, phase shift mask or PSM tools, resolution enhancement technology or RET tools, etc.), etc. to prepare the electronic design. Once sign-off and/or design closure is achieved, the electronic design (e.g., a modified version of 430 with reduced interferences and disturbances) is finalized for tapeout; and the electronic design is transmitted to mask fabrication equipment for mask preparation and mask writing to produce photomasks that are then used in the actual manufacturing of the electronic circuits represented by the electronic design.

The one or more computing systems 400 may further write to and read from a local or remote (e.g., networked storage device(s)) non-transitory computer accessible storage 462 that stores thereupon data or information such as, but not limited to, one or more databases (474) such as schematic design database(s) or physical design database(s), electronic circuit design specification database(s), techfiles for multiple design fabrics, various statistics, various data, rule decks, various design rules, constraints, etc. (472), or other information or data (476) that may be used to facilitate the performance of various functions to achieve the intended purposes. The one or more databases may also include, for example, one or more data structures for facilitating determination of layout equivalence in multi-fabric electronic designs.

In some embodiments, the computing system 400 may include the various resources 428 such that these various resources may be invoked from within the computing system via a network or a computer bus 480 (e.g., an internet session, an intranet session, a data bus interfacing a microprocessor 492 and the non-transitory computer accessible storage medium 498 or a system bus 490 between a microprocessor 492 and one or more engines in the various resources 428). In some other embodiments, some or all of these various resources may be located remotely from the computing system 400 such that the computing system may access the some or all of these resources via a computer bus 480 and one or more network components.

The computing system may also include one or more modules in the set of modules 452. One or more modules in the set 452 may include or at least function in conjunction with a microprocessor 492 via a computer bus 494 to access or invoke various modules in 452 (e.g., 402-412 described above) in some embodiments. In these embodiments, a single microprocessor 492 may be included in and thus shared among more than one module even when the computing system 400 includes only one microprocessor 492. A microprocessor 492 may further access some non-transitory memory 498 (e.g., random access memory or RAM) via a system bus 496 to read and/or write data during the microprocessor's execution of processes.

The set of modules 452 may also include one or more extraction modules to identify various data or information such as the schematic connectivity from a schematic design, physical design connectivity from a hierarchical physical design, parasitics from a hierarchical physical design, and/or hierarchy information from a hierarchical schematic design and/or a hierarchical physical design. The set of modules 452 may further optionally include one or more signoff modules (not shown) to perform various signoff and design closure tasks to ensure that the electronic design implemented by various techniques described herein may be successfully fabricated while maintaining various performance, cost, reliability, and manufacturability requirements.

For example, the one or more signoff modules may include one or more timing signoff modules to perform timing analyses and timing closure related tasks (e.g., silicon-accurate timing signoff, signal integrity analyses, etc.) to ensure an electronic design meets power, performance, or other requirements before tapeout, one or more signoff parasitic extraction modules to provide silicon-accurate interconnect parasitic extraction and ensure first-pass silicon success, and one or more power signoff modules to perform various power integrity analyses, transistor-level electromigration and IR-drop analyses, or other power and signal integrity analyses with SPICE-level accuracy or better accuracy with SPICE or SPICE-like simulations (e.g., Fast-SPICE, HSPICE, PSPICE, or any other SPICE-based or SPICE-compatible simulations) to ensure an electronic design meets or exceeds power, performance, and/or area goals in some embodiments.

The one or more signoff modules may include one or more physical verification modules (not shown) to perform various design rule checking, layout vs. schematic (LVS), etc. tasks to ensure that an electronic design meets or exceeds various spatial and other physical rules and one or more design for manufacturing (DFM) modules to address physical signoff and electrical variability optimization, correct lithography hotspots, predict silicon contours, improve yield, detect and repair timing and leakage hotspots to achieve variation- and manufacturing-aware signoff and design closure in some of these embodiments.

In addition or in the alternative, the one or more signoff modules may include one or more one or more computational lithography modules (not shown) to provide more accurate post-etch critical dimension accuracy and process windows on silicon, reticle and wafer synthesis, etc. to eliminate errors and/or reduce mask-manufacturing cycle times. One or more of these multi-fabric signoff modules may operate on the electronic design produced or modified with various techniques to be described in the following sections for proper signoff and design closure so that the signoff version of the electronic design may be properly manufactured with first-pass or fewer passes silicon success in some embodiments. In these embodiments, the signoff version of the electronic design produced or modified with various techniques described herein causes the underlying electronic circuit to be manufactured by a foundry or IC (integrated circuit) fabrication facility when the signoff version of the electronic design is forwarded to the foundry or IC fabrication facility that in turn fabricates the requisite photomasks and the eventual electronic circuit.

In some embodiments, the computing system 400 may include the various resources 428 such that these various resources may be invoked from within the computing system via a computer bus 480 (e.g., a data bus interfacing a microprocessor 492 and the non-transitory computer accessible storage medium 498 or a system bus 490 between a microprocessor 492 and one or more engines in the various resources 428). In some other embodiments, some or all of these various resources may be located remotely from the computing system 400 such that the computing system may access the some or all of these resources via a computer bus 480 and one or more network components.

The computing system may also include one or more modules in the set of modules 452. One or more modules in the set 452 may include or at least function in tandem with a microprocessor 492 via a computer bus 494 in some embodiments. In these embodiments, a single microprocessor 492 may be included in and thus shared among more than one module even when the computing system 400 includes only one microprocessor 492. A microprocessor 492 may further access some non-transitory memory 498 (e.g., random access memory or RAM) via a system bus 496 to read and/or write data during the microprocessor's execution of processes.

The one or more computing systems 400 may invoke and execute one or more modules in 428 and/or 452 to perform various functions. Each of these modules may be implemented as a pure hardware implementation (e.g., in the form of firmware, application specific IC, etc.), a pure software implementation, or a combination of hardware and software implementation. In some embodiments where a module is implemented at least partially as a software implementation, the module may be stored at least partially in memory (e.g., in random access memory, instruction cache, etc.) of at least one of these one or more computing systems 400 for execution.

System Architecture Overview

FIG. 5 illustrates a computerized system on which a method for implementing an electronic design having embedded circuits may be implemented. Computer system 500 includes a bus 506 or other communication module for communicating information, which interconnects subsystems and devices, such as processor 507, system memory 508 (e.g., RAM), static storage device 509 (e.g., ROM), disk drive 510 (e.g., magnetic or optical), communication interface 514 (e.g., modem or Ethernet card), display 511 (e.g., CRT or LCD), input device 512 (e.g., keyboard), and cursor control (not shown). The illustrative computing system 500 may include an Internet-based computing platform providing a shared pool of configurable computer processing resources (e.g., computer networks, servers, storage, applications, services, etc.) and data to other computers and devices in an ubiquitous, on-demand basis via the Internet. For example, the computing system 500 may include or may be a part of a cloud computing platform in some embodiments.

According to one embodiment, computer system 500 performs specific operations by one or more processor or processor cores 507 executing one or more sequences of one or more instructions contained in system memory 508. Such instructions may be read into system memory 508 from another computer readable/usable storage medium, such as static storage device 509 or disk drive 510. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 507, where the one or more processors, one or more processor cores, or combination thereof executes one or more threads. For example, the acts of determination, extraction, stitching, simulating, annotating, analyzing, optimizing, and/or identifying, etc. may be performed by one or more processors, one or more processor cores, or combination thereof. In one embodiment, the parasitic extraction, current solving, current density computation and current or current density verification is done in memory as layout objects or nets are created or modified.

The term "computer readable storage medium" or "computer usable storage medium" as used herein refers to any non-transitory medium that participates in providing instructions to processor 507 for execution. Such a medium may take many forms, including but not limited to, non-volatile media and volatile media. Non-volatile media includes, for example, optical or magnetic disks, such as disk drive 510. Volatile media includes dynamic memory, such as system memory 508. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 500. According to other embodiments of the invention, two or more computer systems 500 coupled by communication link 515 (e.g., LAN, PTSN, or wireless network) may perform the sequence of instructions required to practice the invention in coordination with one another.

Computer system 500 may transmit and receive messages, data, and instructions, including program (e.g., application code) through communication link 515 and communication interface 514. Received program code may be executed by processor 507 as it is received, and/or stored in disk drive 510, or other non-volatile storage for later execution. In an embodiment, the computer system 500 operates in conjunction with a data storage system 531, e.g., a data storage system 531 that includes a database 532 that is readily accessible by the computer system 500. The computer system 500 communicates with the data storage system 531 through a data interface 533. A data interface 533, which is coupled to the bus 506 (e.g., memory bus, system bus, data bus, etc.), transmits and receives electrical, electromagnetic or optical signals that include data streams representing various types of signal information, e.g., instructions, messages and data. In embodiments of the invention, the functions of the data interface 533 may be performed by the communication interface 514.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for implementing an electronic design having embedded circuits, comprising:

identifying connectivity of an electronic design, where
the electronic design comprises an embedded circuit, and
the embedded circuit is located between a first actual layer and a second actual layer of the electronic design and is respectively connected to the first and the second actual layer with a first interconnect and a second interconnect;

transforming, by one or more embedded circuit modules stored at least partially in memory of and functioning in conjunction with at least one microprocessor of a computing system, the electronic design into a transformed electronic design at least by generating one or more artificial interconnects between the embedded circuit and a plurality of metal patches located on one or more artificial planes;

re-establishing the connectivity based at least in part upon the plurality of metal patches; and implementing the electronic design based at least in part upon predicted behaviors of the transformed electronic design.

2. The computer implemented method of claim 1, wherein transforming the electronic design into the transformed electronic design comprises:

adding the plurality of metal patches to a plurality of artificial layers based at least in part upon the connectivity pertaining to at least the embedded circuit, wherein a metal patch in the plurality of metal patches covers at least a projected area of the embedded circuit with an overhanging margin for grounding the metal patch.

3. The computer implemented method of claim 2, wherein transforming the electronic design into the transformed electronic design comprises:

adding a plurality of artificial layers to the electronic design based at least in part upon the first actual layer and the second actual layer;

identifying a first circuit component from one or more circuit components in the electronic design based in part or in whole upon the connectivity of the electronic design;

removing a first interconnect between the first circuit component and the electronic design;

modifying the first circuit component into a first modified circuit component based in part or in whole upon a first metal patch of the plurality of metal patches; and modifying the first metal patch into a first modified metal patch based at least in part upon the first modified circuit component.

4. The computer implemented method of claim 3, wherein transforming the electronic design into the transformed electronic design comprises:

identifying a second circuit component from the one or more circuit components in the electronic design based in part or in whole upon the connectivity of the electronic design;

removing a second interconnect between the second circuit component and the electronic design;

modifying the second circuit component into a second modified circuit component based in part or in whole upon a second metal patch of the plurality of metal patches; and modifying the second metal patch into a second modified metal patch based at least in part upon the second modified circuit component.

5. The computer implemented method of claim 3, wherein modifying the first circuit component comprises:

identifying the embedded circuit in the electronic design;
identifying or creating a node in the embedded circuit;
identifying a set of decoupling requirements; and
determining a position of a first artificial layer based at least in part upon the set of decoupling requirements.

6. The computer implemented method of claim 5, wherein modifying the first circuit component comprises:

assigning one or more electrical properties to the first modified circuit component;

determining an anti-pad for the first modified circuit component based at least in part upon the first artificial layer; and determining an objective for de-embedding based in part or in whole upon one or more characteristics of the electronic design.

7. The computer implemented method of claim 6, wherein modifying the first circuit component comprises:

modifying the position of the first artificial layer based in part or in whole upon the objective;

determining one or more geometric characteristics for the first modified circuit component; and determining the first modified circuit component from the node to the first artificial layer with the anti-pad.

8. The computer implemented method of claim 7, wherein re-establishing the connectivity comprises:

connecting the first modified circuit component to the transformed electronic design with a first modified artificial interconnect of the one or more artificial interconnects based at least in part upon the connectivity;

connecting the second modified circuit component to the transformed electronic design with a second modified artificial interconnect of the one or more artificial interconnects based at least in part upon the connectivity; and generating a model for the transformed electronic design.

9. The computer implemented method of claim 8, wherein generating the model comprises:

determining one or more first modeling characteristics for the first modified circuit component;

determining one or more second modeling characteristics for a medium that is introduced by the first modified circuit component; and constructing a model for the transformed electronic design with at least one of the first modified circuit component, the first artificial layer, the one or more first modeling characteristics, or the one or more second modeling characteristics.

10. The computer implemented method of claim 1, wherein implementing the electronic design comprises:

generating predicted electromagnetic wave responses at least by performing one or more analyses on a model that is built upon the transformed electronic design;

determining one or more parameters for the transformed electronic design with the predicted electromagnetic wave responses; and implementing the electronic design based at least in part upon the one or more parameters that are associated with one or more return paths.

11. A system for implementing an electronic design having embedded circuits, comprising:

non-transitory computer accessible storage medium storing thereupon program code; and one or more one or more embedded circuit modules stored at least partially in memory of and functioning in conjunction with at least one microprocessor of one or more computing systems, wherein the at least one microprocessor of the one or more computing systems is configured to execute at least the one or more embedded circuit modules at least to:

identify connectivity of an electronic design, where the electronic design comprises an embedded circuit, and the embedded circuit is located between a first actual layer and a second actual layer of the electronic design and is respectively connected to the first and the second actual layer with a first interconnect and a second interconnect;

transform the electronic design into a transformed electronic design at least by generating one or more artificial interconnects between the embedded circuit and a plurality of metal patches located on one or more artificial planes;

re-establish the connectivity based at least in part upon the plurality of metal patches; and implement the electronic design based at least in part upon predicted behaviors of the transformed electronic design.

12. The system for claim 11, wherein the at least one micro-processor that is configured to execute at least the one or more embedded circuit modules is further configured to:

adding a plurality of artificial layers to the electronic design based at least in part upon the first actual layer and the second actual layer, wherein a metal patch in the plurality of metal patches covers at least a projected area of the embedded circuit with an overhanging margin for grounding the metal patch;

adding the plurality of metal patches to the plurality of artificial layers based at least in part upon the connectivity pertaining to at least the embedded circuit;

identifying a first circuit component from one or more circuit components in the electronic design based in part or in whole upon the connectivity of the electronic design;

removing a first interconnect between the first circuit component and the electronic design;

modifying the first circuit component into a first modified circuit component based in part or in whole upon a first metal patch of the plurality of metal patches; and modifying the first metal patch into a first modified metal patch based at least in part upon the first modified circuit component.

13. The system for claim 12, wherein the at least one micro-processor that is configured to execute at least the one or more embedded circuit modules is further configured to:

identify a second circuit component from the one or more circuit components in the electronic design based in part or in whole upon the connectivity of the electronic design;

remove a second interconnect between the second circuit component and the electronic design;

modify the second circuit component into a second modified circuit component based in part or in whole upon a second metal patch of the plurality of metal patches; and modify the second metal patch into a second modified metal patch based at least in part upon the second modified circuit component.

14. The system for claim 12, wherein the at least one micro-processor that is configured to execute at least the one or more embedded circuit modules is further configured to:

identify the embedded circuit in the electronic design;

identify or create a node in the embedded circuit;

identify a set of decoupling requirements;

determine a position of a first artificial layer based at least in part upon the set of decoupling requirements;

assign one or more electrical properties to the first modified circuit component;

determine an anti-pad for the first modified circuit component based at least in part upon the first artificial layer; and determine an objective for de-embedding based in part or in whole upon one or more characteristics of the electronic design.

15. The system for claim 14, wherein the at least one micro-processor that is configured to execute at least the one or more embedded circuit modules is further configured to:

modify the position of the first artificial layer based in part or in whole upon the objective;

determine one or more geometric characteristics for the first modified circuit component;

determine the first modified circuit component from the node to the first artificial layer with the anti-pad;

connect the first modified circuit component to the transformed electronic design with a first modified artificial interconnect of the one or more artificial interconnects based at least in part upon the connectivity;

connect the second modified circuit component to the transformed electronic design with a second modified artificial interconnect of the one or more artificial interconnects based at least in part upon the connectivity; and generate a model for the transformed electronic design.

16. An article of manufacture comprising a non-transitory computer accessible storage medium having stored thereupon a sequence of instructions which, when executed by at least one processor or at least one processor core executing one or more threads, causes the at least one processor or the at least one processor core to perform a set of acts for implementing an electronic design having embedded circuits, the set of acts comprising:

identifying connectivity of an electronic design, where the electronic design comprises an embedded circuit, and the embedded circuit is located between a first actual layer and a second actual layer of the electronic design and is respectively connected to the first and the second actual layer with a first interconnect and a second interconnect;

transforming, by one or more embedded circuit modules stored at least partially in memory of and functioning in conjunction with at least one microprocessor of a computing system, the electronic design into a transformed electronic design at least by generating one or more artificial interconnects between the embedded circuit and a plurality of metal patches located on one or more artificial planes;

re-establishing the connectivity based at least in part upon the plurality of metal patches; and implementing the electronic design based at least in part upon predicted behaviors of the transformed electronic design.

17. The article of manufacture of claim 16, the set of acts further comprising:

adding a plurality of artificial layers to the electronic design based at least in part upon the first actual layer and the second actual layer, wherein a metal patch in the plurality of metal patches covers at least a projected area of the embedded circuit with an overhanging margin for grounding the metal patch;

adding the plurality of metal patches to the plurality of artificial layers based at least in part upon the connectivity pertaining to at least the embedded circuit;

identifying a first circuit component from one or more circuit components in the electronic design based in part or in whole upon the connectivity of the electronic design;

removing a first interconnect between the first circuit component and the electronic design;

modifying the first circuit component into a first modified circuit component based in part or in whole upon a first metal patch of the plurality of metal patches; and modifying the first metal patch into a first modified metal patch based at least in part upon the first modified circuit component.

18. The article of manufacture of claim 17, the set of acts further comprising:

identifying the embedded circuit in the electronic design;

identifying or creating a node in the embedded circuit;

identifying a set of decoupling requirements;

determining a position of a first artificial layer based at least in part upon the set of decoupling requirements;

assigning one or more electrical properties to the first modified circuit component;

determining an anti-pad for the first modified circuit component based at least in part upon the first artificial layer; and determining an objective for de-embedding based in part or in whole upon one or more characteristics of the electronic design.

19. The article of manufacture of claim 16, the set of acts further comprising:

modifying the position of the first artificial layer based in part or in whole upon the objective;

determining one or more geometric characteristics for the first modified circuit component;

determining the first modified circuit component from the node to the first artificial layer with the anti-pad;

connecting the first modified circuit component to the transformed electronic design with a first modified artificial interconnect of the one or more artificial interconnects based at least in part upon the connectivity;

connecting the second modified circuit component to the transformed electronic design with a second modified artificial interconnect of the one or more artificial interconnects based at least in part upon the connectivity; and generating a model for the transformed electronic design.

20. The article of manufacture of claim 19, the set of acts further comprising:

determining one or more first modeling characteristics for the first modified circuit component;

determining one or more second modeling characteristics for a medium that is introduced by the first modified circuit component;

constructing a model for the transformed electronic design with at least one of the first modified circuit component, the first artificial layer, the one or more first modeling characteristics, or the one or more second modeling characteristics;

generating predicted electromagnetic wave responses at least by performing one or more analyses on a model that is built upon the transformed electronic design;

determining one or more parameters for the transformed electronic design with the predicted electromagnetic wave responses; and implementing the electronic design based at least in part upon the one or more parameters that are associated with one or more return paths.

* * * * *